United States Patent
Igaki et al.

(10) Patent No.: US 7,622,698 B2
(45) Date of Patent: Nov. 24, 2009

(54) DETECTION HEAD

(75) Inventors: Masahiko Igaki, Yokohama (JP); Akio Atsuta, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/774,154

(22) Filed: Jul. 6, 2007

(65) Prior Publication Data

US 2008/0018911 A1   Jan. 24, 2008

(30) Foreign Application Priority Data

Jul. 19, 2006 (JP) .............................. 2006-197041

(51) Int. Cl.
*G01B 11/14* (2006.01)
(52) U.S. Cl. ............... 250/206.1; 250/239; 250/551
(58) Field of Classification Search ........... 250/239, 250/551; 385/14, 15, 88–94; 257/80–83, 257/98–100
See application file for complete search history.

(56) References Cited

U.S. PATENT DOCUMENTS

| | | | |
|---|---|---|---|
| 6,454,467 B1 * | 9/2002 | Ishihara et al. ............... 385/88 |
| 7,022,974 B2 * | 4/2006 | Igaki et al. ............ 250/231.13 |
| 7,026,654 B2 | 4/2006 | Igaki et al. .................... 257/80 |
| 7,045,770 B2 | 5/2006 | Igaki et al. | |
| 2003/0002826 A1 * | 1/2003 | Cohen et al. .................. 385/94 |

FOREIGN PATENT DOCUMENTS

| JP | 62-76684 | 4/1987 |
|---|---|---|
| JP | 2003-337052 A | 11/2003 |
| JP | 2004-006753 A | 1/2004 |

OTHER PUBLICATIONS

Chinese Office Action in Chinese Application No. 2007-101370129 dated Dec. 5, 2008.

* cited by examiner

*Primary Examiner*—Georgia Y Epps
*Assistant Examiner*—Tony Ko
(74) *Attorney, Agent, or Firm*—Fitzpatrick, Cella, Harper & Scinto

(57) ABSTRACT

A reflective sensor is disclosed which prevents divergent light from a light source from being totally reflected by an interface between the package and the outside thereof and entering a light-receiving element without using a light-shield means and which allows an improved S/N ratio and reduced variations in performance. The reflective sensor includes a light-emitting element and a light-receiving element which are provided on a surface, and a light-transmissive member which covers the light-emitting element and the light-receiving element. The light-receiving element includes a light-receiving region which is spaced from the light-emitting element along the surface, and which light-receiving region is closer to the light-emitting element than an area on the surface that would be illuminated by unimpeded light rays which are totally reflected by an interface between the light-transmissive member and the outside thereof and are directed toward the light-receiving element.

7 Claims, 25 Drawing Sheets

PRIOR ART

PRIOR ART

DETECTION HEAD

BACKGROUND OF THE INVENTION

The present invention relates to a reflective sensor which projects light emitted from a light-emitting element onto an object to be measured, receives the light reflected thereby at a light-receiving element, and detects displacement of the object on the basis of a change in the amount of the received light.

FIG. 23 is a perspective view showing a reflective encoder in the related art. FIG. 24 shows an XZ section thereof. FIG. 25 shows a YZ section orthogonal to a displacement detection axis corresponding to an X axis. Light rays are radiated from a light-emitting element 1 formed of an LED chip, and some of the light is reflected by a reflective scale 2 and is received by a light-receiving element 3 formed of a photo-IC chip containing a signal processing circuit. The light-emitting element 1 and the light-receiving element 3, each of which is a semiconductor device, are die-bonded to a printed circuit substrate 4 and covered with transparent members constituted by a light-transmissive resin 5 and a transparent glass substrate 6. The light-emitting element 1, the light-receiving element 3, the substrate 4, the resin 5, and the transparent glass substrate 6 constitute a detection head 7.

On the other hand, the reflective scale 2 is formed of a reflective scale base material 8 and a reflective-layer-forming portion 11 including a reflective layer 9 and another reflective layer 10. A reflective encoder of the abovementioned type has been disclosed in Japanese Patent Laid-Open No. 2003-337052.

FIG. 26 is a perspective view showing a detection head part of another reflective encoder in the related art that has been disclosed in Japanese Patent Laid-Open No. 2004-6753. FIG. 27 is a section view thereof. A circuit pattern 12a in a predetermined shape is formed on a substrate 12. A light-emitting element 13 which has a light-emitting region 13a and a light-receiving element 14 which has a light-receiving region 14a and includes a signal processing circuit are die-bonded to the circuit pattern 12a. Each of terminals of the light-emitting element 13 and the light-receiving element 14 is connected through wires 15.

The light-emitting element 13, the light-receiving element 14, and the wires 15 are covered with a surrounding layer 16 made of transparent resin material and a transparent glass substrate 17. As shown in FIG. 27, the surrounding layer 16 needs to have a height equal to or more than those of the light-emitting element 13 and the light-receiving element 14. The thickness of the surrounding layer 16 is determined by taking account of the loop heights of the wires 15 and the margin for bonding of the optical semiconductor components to the substrate 12.

As shown in FIGS. 26 and 27, a light-shield wall 18 is formed approximately at the midpoint between the light-emitting element 13 and the light-receiving element 14. The circuit pattern 12a is placed immediately below the light-shield wall 18. As shown in FIG. 27, the light-shield wall 18 is formed by filling a groove having a width W with a light-blocking resin. A depth d of the groove before it is filled with the light-blocking resin is slightly smaller than the total thickness of the surrounding layer 16 and the transparent glass substrate 17 to protect the circuit pattern 12a on the substrate 12.

The light-shield wall 18 is provided to prevent the light emitted from the light-emitting region 13a of the light-emitting element 13 from being propagated through the surrounding layer 16 and entering the light-receiving region 14a of the light-receiving element 14.

For the light-shield member disposed between the light-emitting element 13 and the light-receiving element 14, various methods have been proposed in generally used devices such as reflective sensors and reflective photointerrupters, and some of the methods have been disclosed in Japanese Patent Laid-Open No. 2000-277796, Japanese Patent No. 3782489, and Japanese Patent 3261280.

The following problems have been found in semiconductor packages for reflective encoders and reflective sensors in the related art. For example, in FIG. 25, light rays included in an angular range θ1 correspond to effective light rays which are introduced from the light-emitting region of the light-emitting element 1 to the light-receiving region of the light-receiving element 3 via the reflective scale 2.

If an angle θ2 is significantly large with respect to a principal ray axis a1 on which the highest intensity of the light-emitting element 1 is provided, the light rays in the angular range θ1 including the inclined light ray at the center thereof account for only a small proportion of all of the light rays radiated by the light-emitting element 1. As a result, most of the light rays are ineffective components, leading to the problem of extremely low use efficiency of light.

FIG. 28 shows an enlarged view of part of FIG. 25. When attention is paid to the light rays between the light-emitting element 1 and the light-receiving element 3 in the package, there is a path of light rays represented by a light ray L which is emitted by the light-emitting element 1 and is reflected by a surface portion 6a of the transparent glass substrate 6. If an angle θ3 is larger than the critical angle (θi), the light ray L is totally reflected and enters the light-receiving element 3. The light ray serves as a large bias light component which is superposed on a sensor signal.

In this case, the substantial S/N ratio of the sensor signal is greatly reduced due to the effective reflected light rays contained in the small proportion and the bias component of light contained in the large proportion. The proportion of the effective light rays can be increased by using a lens. However, the use of the lens causes variations in performance of the sensor resulting from a shift in position between the optical axis of the lens, the light-emitting element 1, and the light-receiving element 3.

Increasing the area of the light-receiving region of the light-receiving element 3 is readily contemplated to increase the proportion of the effective light rays. However, the larger light-receiving region receives a larger amount of the totally reflected light from the surface portion 6a of the transparent glass substrate 6, so that almost no improvement can be achieved in the substantial S/N ratio of the sensor signal. In addition, the larger light-receiving region increases the size of the detection head 7 and causes a disadvantage from an economic viewpoint since the cost is inevitably increased.

Increasing the light amount emitted by the light-emitting element 1 is also a conceivable approach for complementing a small amount of light reaching the light-receiving element 3. However, the power consumption is increased and an excessive amount of current is applied to the light-emitting element 1 to present a problem of reducing the life of the light-emitting element 1. Another conceivable approach is to perform signal amplification in the signal processing circuit, but this increases electrical noise components to affect the accuracy in position detection and thus cannot provide an effective means.

The abovementioned approaches including the use of the lens, the larger light-receiving region, the increased amount of the light emitted by the light-emitting element 1, and the enhanced signal amplification factor in the signal processing circuit on the light-receiving element 3 do not realize significant improvement in performance, or increase variations in performance.

The use of the light-shield means shown in FIGS. 26 and 27 can prevent the bias component of light that is one of the problems in the related art described above and attains a considerable degree of improvement. As shown in a graph of FIG. 29, when the light-shield member is used, an output voltage V of the reflective sensor which provides an analog output varies with a distance G between the reflective sensor and a reflective sample serving as an object to be measured.

Specifically, individual reflective sensors provide different output voltages V at a distance d to a reflective sample shown in FIG. 27 depending on variations in the mounting positions of the light-emitting element 13 and the light-receiving element 14, the position of the light-shield wall 18 placed between them, or variations in the light-receiving sensitivity. In other words, the output voltages show various values as v1, v2 and v3 on the vertical axis of the graph in FIG. 29 depending on the individual differences.

If the reflective sensor is used at a distance equal to or smaller than a distance G1, the sensitivity with the distance between the reflective sensor and the reflective sample is high. Thus, the use of the reflective sensor at such a close distance should be avoided practically, so that an extra space area is required accordingly.

Since the light-shield body serving as the light-shield member is placed at the midpoint between the light-emitting element 13 and the light-receiving element 14, a large interval must necessarily be provided between the light-emitting element 13 and the light-receiving element 14. This increases the area for mounting the elements to prevent a reduction in size of the reflective sensor. In addition, the use of the light-shield member inevitably increases the cost.

BRIEF SUMMARY OF THE INVENTION

The present invention provides a reflective sensor which prevents divergent light emitted by a light source from being totally reflected by an interface between a package and the outside thereof and entering a light-receiving element without using a light-shield means and which allows an improved S/N ratio and reduced variations in performance.

According to an aspect, the present invention provides a reflective sensor including a light-emitting element and a light-receiving element which are provided on a surface, and a light-transmissive member which covers the light-emitting element and the light-receiving element. The light-receiving element includes a light-receiving region which is spaced from the light-emitting element along the surface, and which light-receiving region is closer to the light-emitting element than an area on the surface that would be illuminated by unimpeded light rays which are totally reflected by an interface between the light-transmissive member and the outside thereof and are directed toward the light-receiving element.

According to another aspect, the present invention provides a reflective sensor including a light-emitting element and a light-receiving element which are provided on a surface, and a light-transmissive member which covers the light-emitting element and the light-receiving element. The light-receiving element includes a light-receiving region which is provided on the surface within a circle having a radius R from the center of a light-emitting region of the light-emitting element, the radius R being determined as follows:

$$R = D1 \cdot \tan\{\sin^{-1}(No/Ni)\} + D2 \cdot \tan\{\sin^{-1}(No/Ni)\}$$

where Ni represents a refractive index of the light-transmissive member having an interface between the light-transmissive member and the outside thereof, No represents a refractive index of a medium outside of the light-transmissive member, D1 represents a distance from the light-emitting region of the light-emitting element to the interface, and D2 represents a distance from the light-receiving region of the light-receiving element to the interface.

According to still another aspect, the present invention provides an apparatus including the above-described reflective sensor. The apparatus operates based on information provided by the reflective sensor.

Other objects and features of the present invention will be apparent from the following description of a preferred embodiment with reference to the accompanying drawings.

DETAILED DESCRIPTION OF THE PREFERRED EMBODIMENTS

Preferred embodiments of the present invention will hereinafter be described with reference to the drawings.

Embodiment 1

Figure 1:
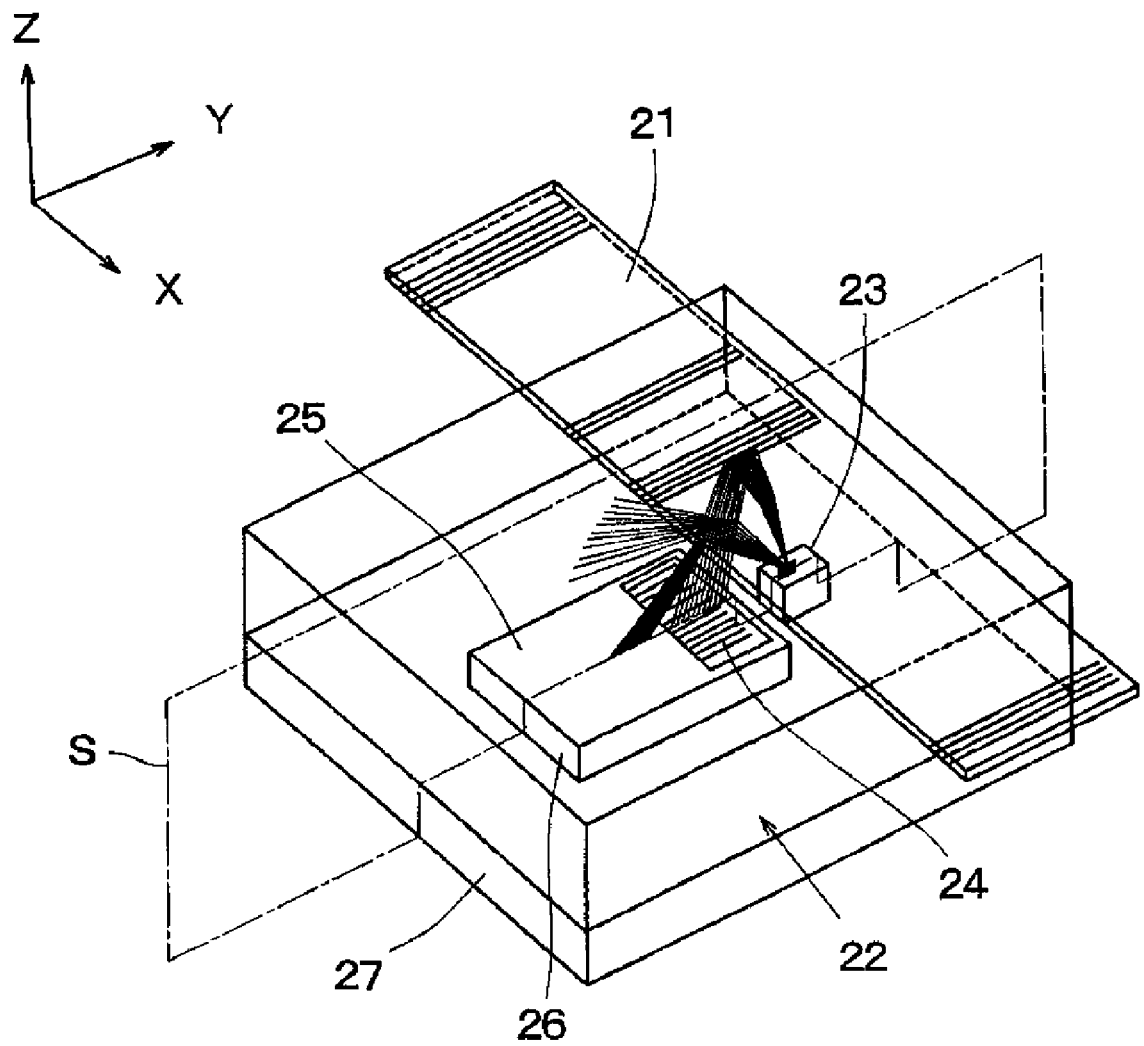
FIG. 1 is a schematic diagram showing the configuration of a reflective encoder that is Embodiment 1 of the present invention.

FIG. 1 is a schematic diagram showing the configuration of a reflective encoder of Embodiment 1. A reflective scale 21 having stripes at regular intervals formed thereon is fixed to a moving object to be measured (hereinafter, the object to be measured is merely referred to as the object) and is movable in the direction of an X axis corresponding to the direction in which the stripes are arranged. A detection head 22 which is a reflective sensor is placed opposite to the reflective scale 21.

The detection head 22 is formed of a light-emitting element 23 realized by a LED chip, a light-receiving element 24 having a photodiode array as a light-receiving portion, a semiconductor device realized by a photo-IC chip 26 including a signal processing circuit part 25, and a substrate 27 on which the abovementioned components are mounted.

Figure 2:
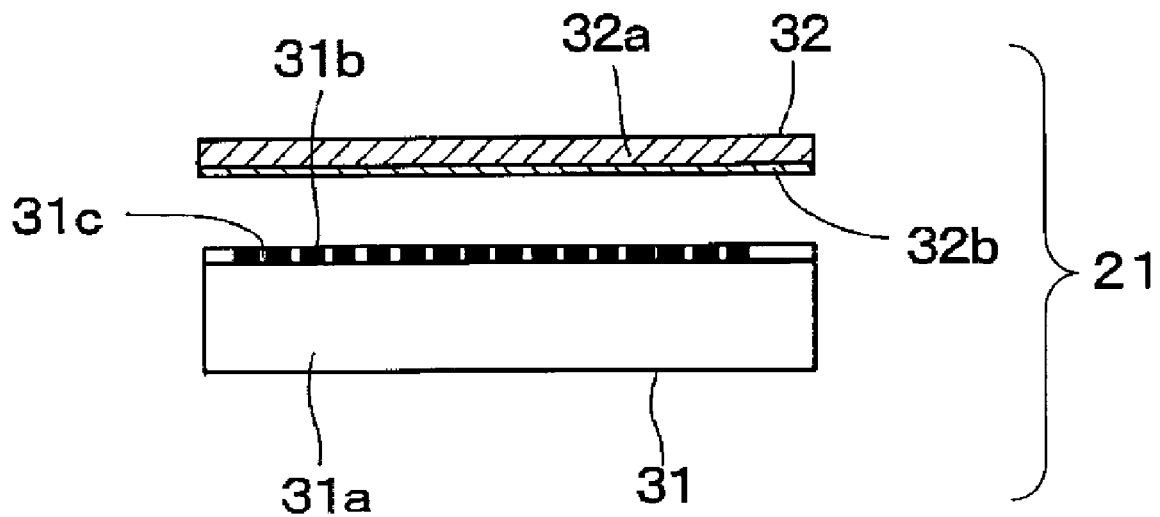
FIG. 2 is a section view showing the reflective encoder before a reflective scale is bonded in Embodiment 1.

As shown in FIG. 2, the reflective scale 21 is formed of a pattern-forming sheet 31 and a reflective-layer-forming sheet 32. The pattern-forming sheet 31 is made of transparent PET film for industrial photoengraving film, for example, with a thickness of approximately 0.1 to 0.2 mm, on which a necessary pattern is formed with an emulsion layer of the industrial photoengraving film through exposure and development steps. A pattern including a non-reflective portion 31b serving as a light-absorbing portion and a light-transmissive portion 31c alternately formed is provided on a base material portion 31a of the pattern-forming sheet 31.

Figure 3:
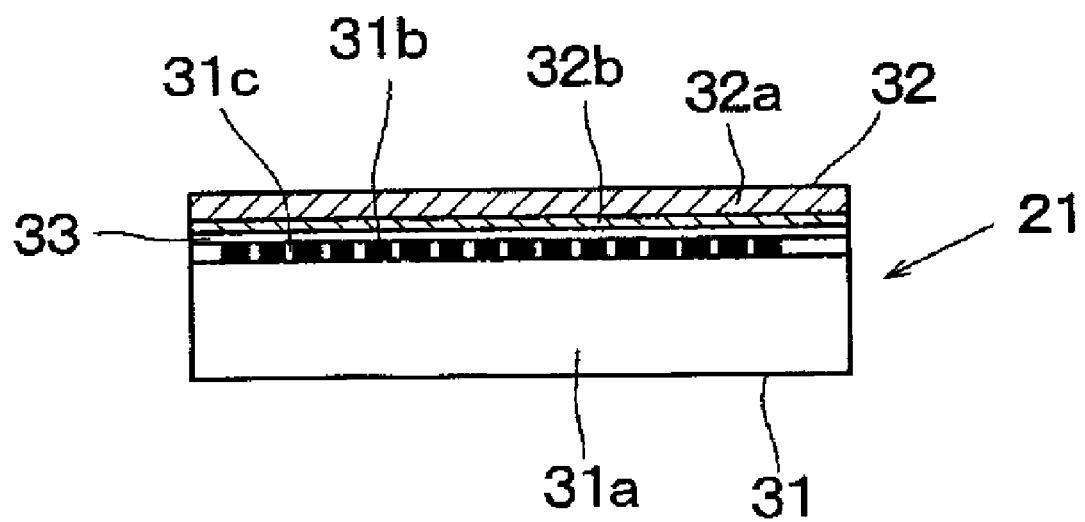
FIG. 3 is a section view showing the bonded reflective scale in Embodiment 1.

In the reflective-layer-forming sheet 32, a reflective layer 32b made of an evaporated film is formed on a lower surface of a reflective layer 32a made of PET film as a base material. The reflective scale 21 is formed by bonding the pattern-forming sheet 31 to the reflective-layer-forming sheet 32 by an adhesion layer 33 made of transparent adhesive as shown in FIG. 3.

Figure 4:
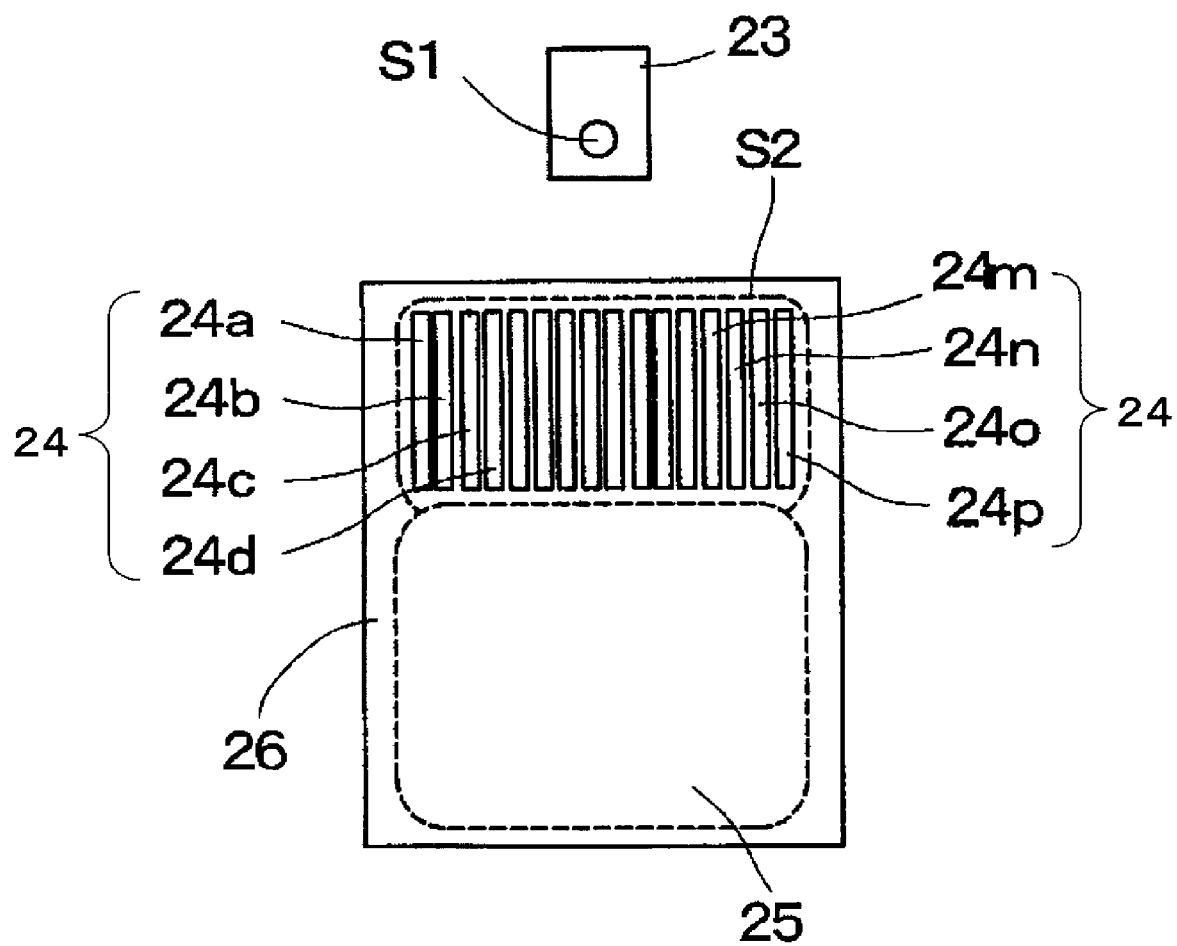
FIG. 4 is a plan view showing main components of a detection head in Embodiment 1.

FIG. 4 is a plane view showing the light-emitting element 23 and the light-receiving element 24 which are main components of the detection head 22. The light-emitting element 23 is formed of a point-source red LED which has a current confinement structure and includes an effective light-emitting region S1 having a circular light-emitting window with a diameter of approximately 80 μm. The emission wavelength of the LED is 650 nm.

Figure 5A:
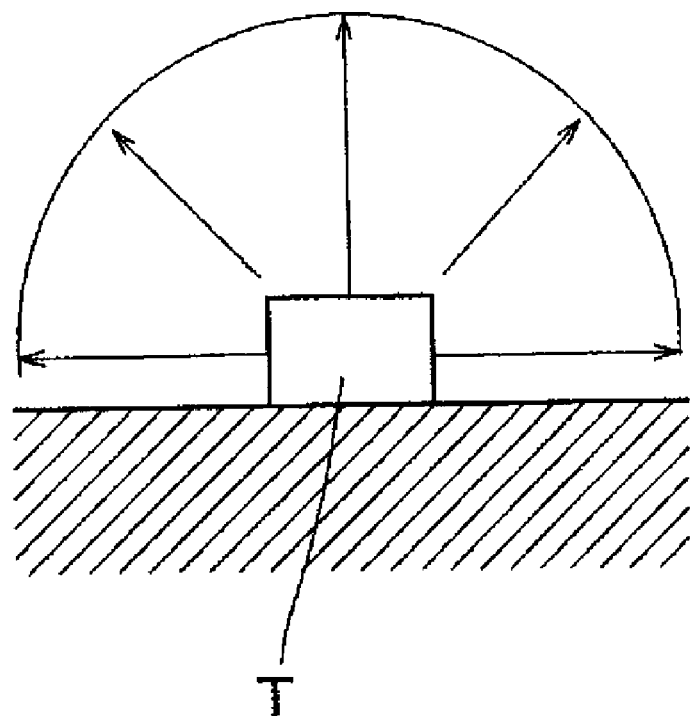
FIGS. 5A and 5B are schematic diagrams for explaining a light-emitting element of a current confinement type in Embodiment 1.
Figure 5B:
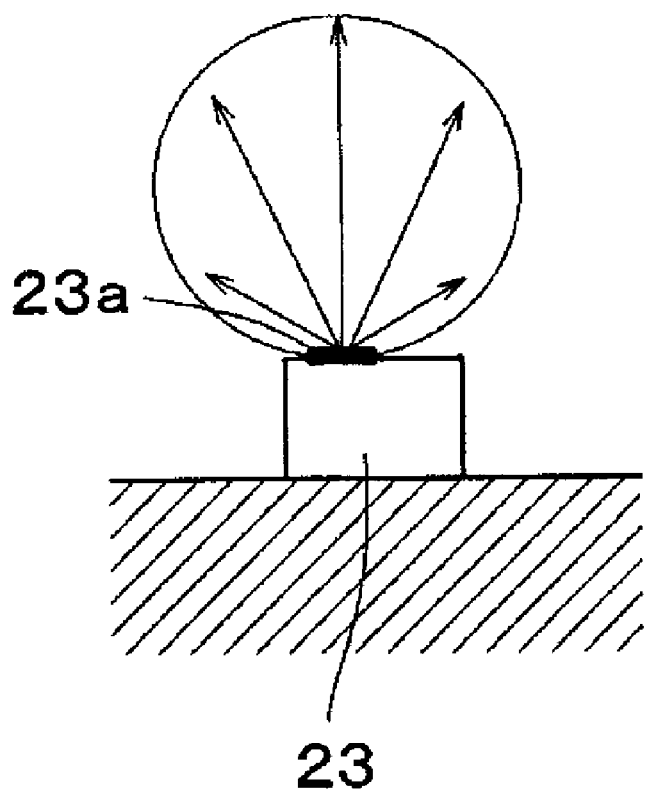

As a countermeasure to prevent light emitted by the light-emitting element 23 from entering directly the light-receiving region of the light-receiving element 24, the light-emitting element 23 is realized by using the LED chip of the current confinement type rather than a typical LED chip formed through epitaxial growth. A typical LED chip T shown in FIG. 5A is greatly different from the light-emitting element 23 of the current confinement type shown in FIG. 5B in the distribution of the intensity of emitted light. The typical LED chip T emits a large amount of light in the horizontal direction and thus some of the light is likely to enter the light-receiving region directly. In contrast, the light-emitting element 23 of the current confinement type emits light rays only forward and thus any of the light is unlikely to enter the light-receiving region directly.

As shown in FIG. 4, the photo-IC chip 26 is placed near the light-emitting element 23. The photo-IC chip 26 includes a light-receiving region S2 corresponding to the light-receiving portion of the light-emitting element 24 placed closer to the light-emitting element 23 and a signal processing circuit part 25. In the light-receiving region S2, 16 photodiodes 24a, 24b, 24c, 24d, ..., 24m, 24n, 24o, and 24p are arranged at regular intervals in the horizontal direction to serve as the light-receiving element 24. The photodiodes 24e to 24l are not shown in the figure.

The photodiodes 24a, 24e, 24i, and 24m are electrically connected to each other to form a set for a phase a. The photodiodes 24b, 24f, 24j, and 24n form a set for a phase b. The photodiodes 24c, 24g, 24k, and 24o, and photodiodes 24d, 24h, 24l, and 24p form a set for a phase c and a set for a phase d, respectively.

Each of the groups of photodiodes for the phases a, b, c, and d receives light and outputs a photocurrent in accordance with the amount of the light. As the reflective scale 21 is moved, the groups of photodiodes for the phases a to d output currents such that the phase b is at 90 degrees, the phase c is at 180 degrees, and the phase d is at 270 degrees relative to the phase a.

The signal processing circuit part 25 on the photo-IC chip 26 converts the output currents into voltages with a current/voltage converter, determines a differential component between the phases a and c and a differential component between the phases b and d with a differential amplifier, and outputs displacement output signals of phases A and B with a phase difference of 90 degrees.

Figure 6:
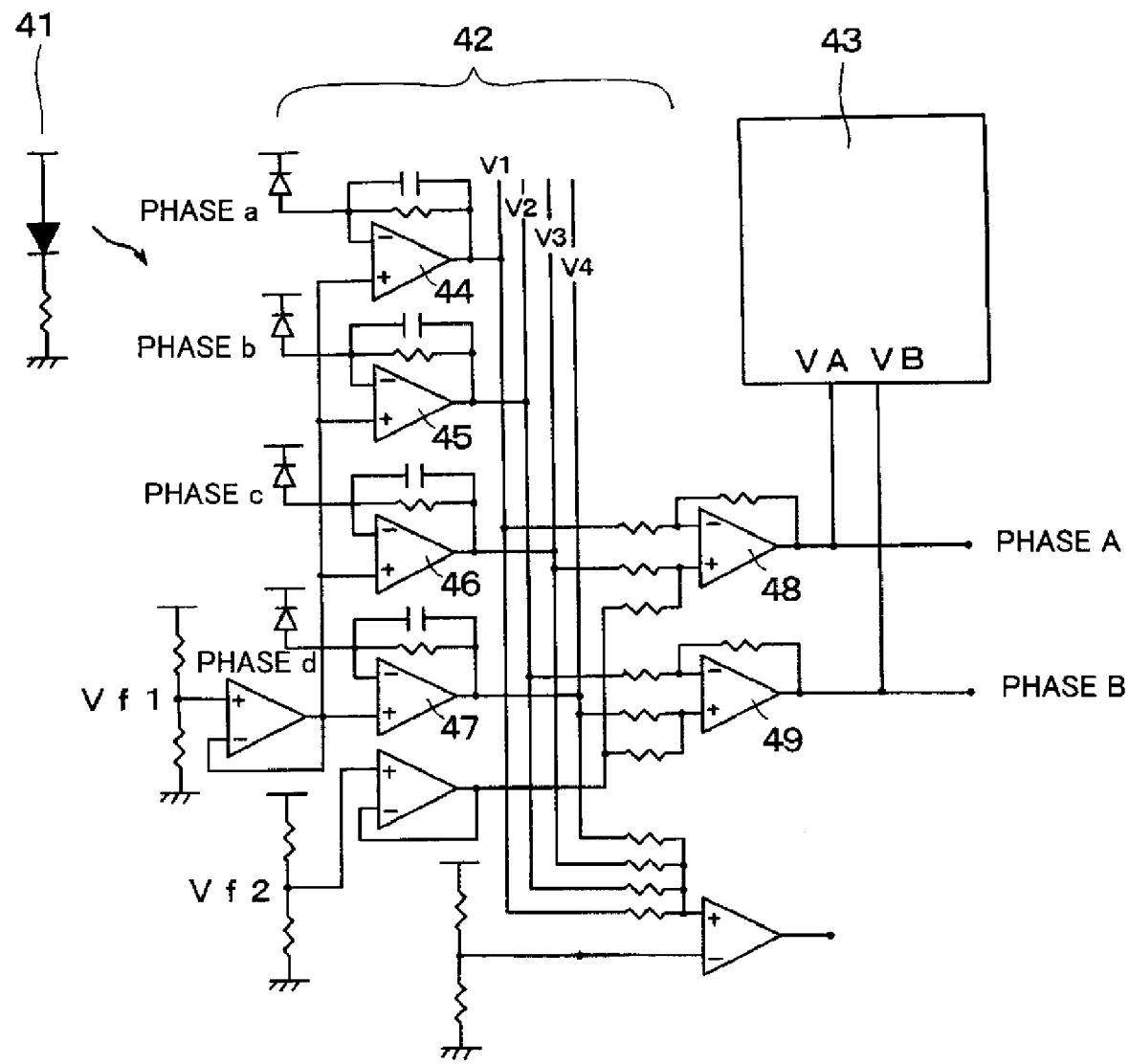
FIG. 6 shows a signal processing circuit of the reflective encoder in Embodiment 1.

FIG. 6 illustrates the signal processing circuit part 25 and shows a light-emitting circuit 41 of the light-emitting element 23 and an analog signal processing part 42. A position calculating part 43 is provided for determining the position of the object by calculating the moving amount of the reflective scale 21 based on analog signals of the phases A and B from the analog signal processing part 42.

First-stage amplifiers 44, 45, 46, and 47 serve as I/V amplifiers for converting the photocurrents produced in the groups of photodiodes for the phases a, b, c, and d into voltages and producing potentials V1, V2, V3, and V4 relative to a potential Vf1, respectively.

A differential output amplifier 48 determines a differential component between the outputs V1 and V3 from the groups of photodiodes for the phases a and c to provide a signal of the phase A with a potential Vf2 as a bias potential. Similarly, a differential output amplifier 49 performs a differential amplification on the outputs V2 and V4 from the group of photodiodes for the phases b and d to provide a signal of the phase B.

The output signals VA and VB from the analog signal processing part 42 are provided by superposing the direct-current component Vf2 on alternate components Va and Vb, respectively, and are output to the position calculating part 43. The position calculating part 43 counts the number of peaks in the output signal of the phase A (VA=Va+Vf2) or the phase B (VB=Vb+Vf2) and determines the number of passed interference fringes formed on the light-receiving region S2 by reflected and diffracted light from the reflective scale 21. The pitch of the interference fringes is multiplied by the counted number to calculate the moving amount of the reflective scale 21.

The phase angle between the phases A and B can be calculated on the basis of the alternate components of the output signals of the phases A and B to determine the moving amount equal to or smaller than the pitch of the interference fringes.

Figure 7:
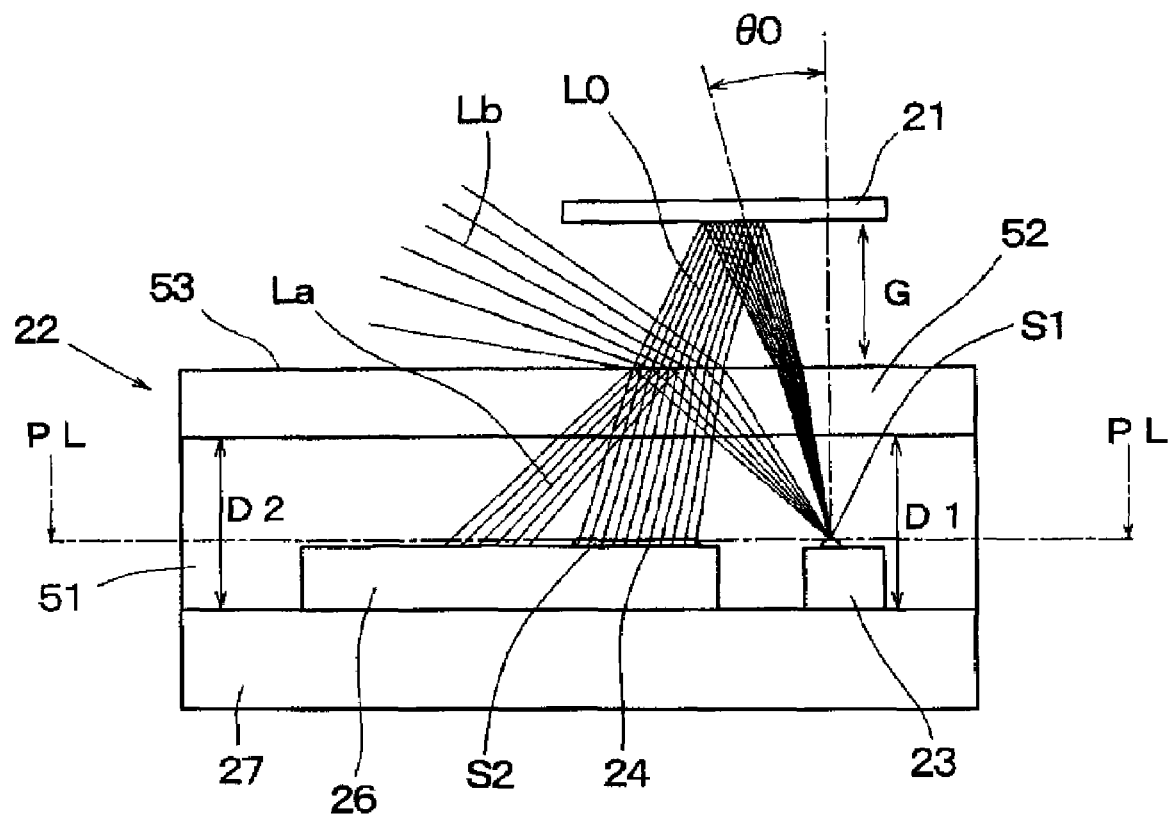
FIG. 7 is a schematic diagram for explaining the optical paths of light rays in Embodiment 1.

FIG. 7 is a schematic diagram for explaining the optical paths of light rays in the reflective encoder taken along an S plane shown in FIG. 1. The detection head 22 includes not only the light-emitting element 23 and the light-receiving element 24 but also a light-transmissive sealing resin 51 which covers the substrate 27, the light-emitting element 23, and the light-receiving element 24, and a light-transmissive glass (hereinafter referred to as transparent glass) 52 placed on the sealing resin 51. Since the sealing resin 51 and the transparent glass 52 have substantially the same refractive indexes, they can be regarded as a practically integral member from an optical viewpoint and the boundary between them is ignorable. The sealing resin 51 and the transparent glass 52 constitute a light-transmissive member which covers the light-emitting element 23 and the light-receiving element 24.

The detection head 22 covered with the light-transmissive member constitutes a package of the reflective encoder.

Divergent light rays from the light-emitting element 23 are applied to the flat reflective scale 21. The reflected and diffracted light from the reflective scale 21 forms interference fringes on the light-receiving region S2 of the photo-IC chip 26.

As shown in FIG. 7, the detection head 22 and the reflective scale 21 are placed with a gap G therebetween. When the pitch of the reflective scale 21 is represented by Ps, the interference fringes having a period double the pitch Ps (Pf=2×Ps) is formed on the light-receiving region S2. The movement of the interference fringes associated with the movement of the reflective scale 21 is converted into the analog signals of the phases A and B as the displacement signals by the abovementioned signal processing circuit part 25.

FIG. 7 shows representative light rays L0, La, and Lb relating to Embodiment 1, of light rays radiated by the light-emitting element 23. The light rays L0 show a group of light rays refracted by and transmitted through an interface 53 between the light-transmissive member (transparent glass 52) and the outside thereof, reflected by the reflective scale 21, and directed toward the light-receiving region S2. The light rays L0 correspond to effective light for providing the sensor signal.

The light rays La are emitted by the light-emitting element 23, totally reflected by the interface 53, and propagated through the package. The light rays La are noise light which does not contribute to the sensor signal light and should not be received, in contrast to the light rays L0 serving as the effective light for the sensor signal described above. If the light rays La enter the light-receiving region S2, the S/N ratio of the sensor signal is reduced.

The light rays Lb pass through the interface 53 and travel outward without reaching the reflective scale 21, so that the light rays Lb hardly affect the measurement accuracy and the like.

In Embodiment 1, to prevent the unnecessary light rays La from reaching the light-receiving element 24, the position of the light-receiving region S2 of the light-receiving element 24 is determined with the light-emitting region S1 of the light-emitting element 23 used as a reference position.

Specifically, the light-receiving region S2 of the light-receiving element 24 is placed closer to the light-emitting element 23 than the optical path of the light rays which are totally reflected by the interface 53 and then directed toward the light-receiving element 24, of all the light rays emitted form the light-emitting element 23.

Figure 8A:
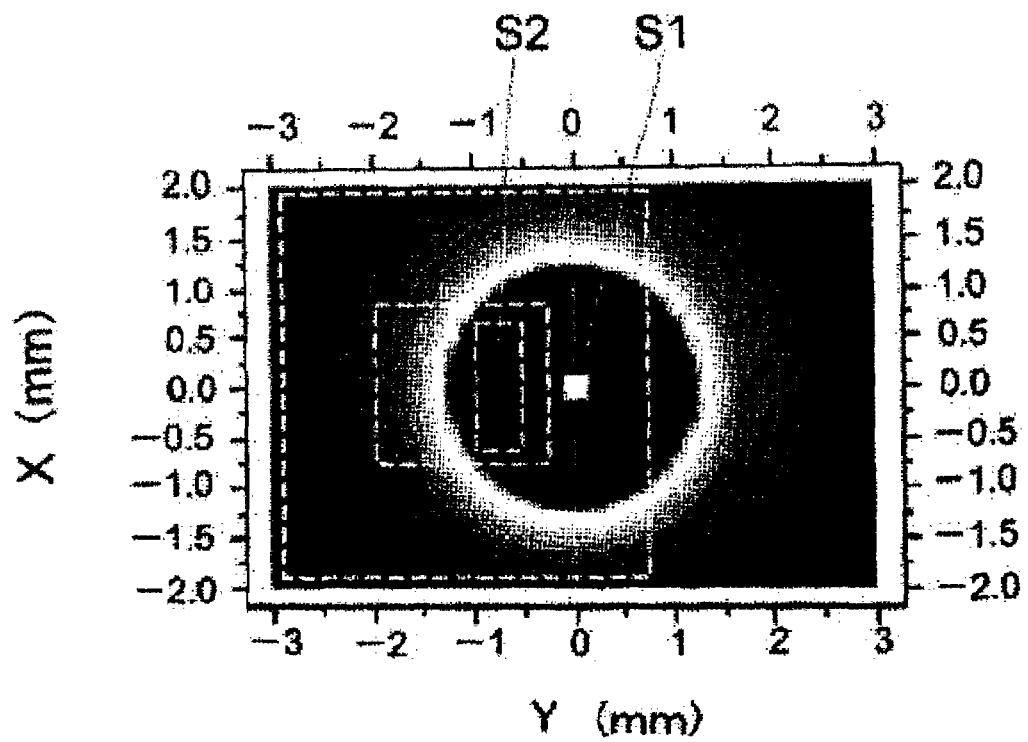
FIGS. 8A and 8B show an illuminance distribution chart in a PL section and an illuminance graph for the distance from a light source, respectively, in Embodiment 1.
Figure 8B:
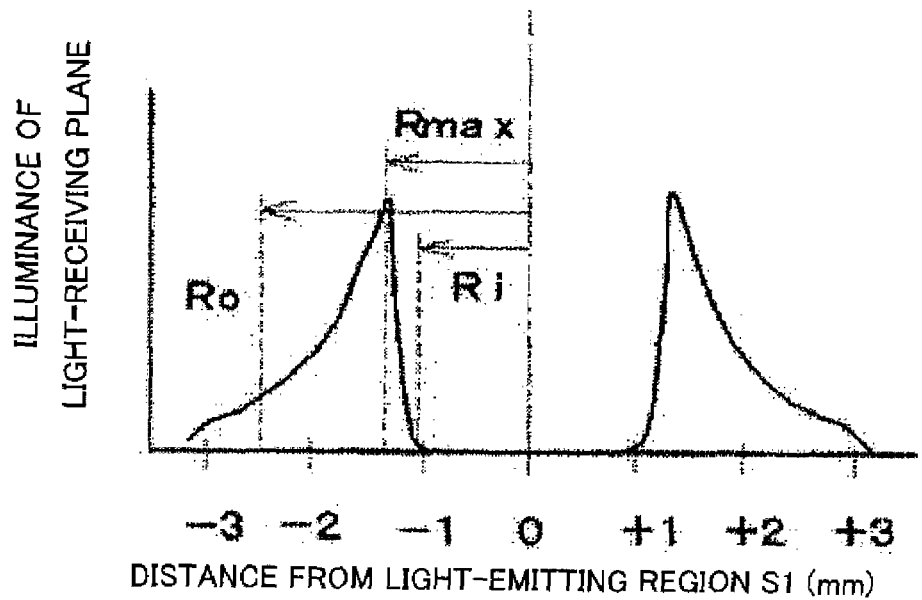

FIGS. 8A and 8B show the simulation results of the illuminance distribution of the reflected light from the interface 53 in a PL section shown in FIG. 7 including the light-receiving region S2. In the simulation, the reflective scale 21 is removed to prevent the effective light components reflected by the reflective scale 21 from being superposed on the observation plane (PL section).

In FIG. 8A, the light-emitting region S1 is placed at the position of a white box at the center of the illuminance distribution. The light-receiving region S2 is show by a dotted line on the left thereof. In the illuminance distribution chart, an annular bright portion as a white portion represents a high-illuminance region due to the reflected light rays from the interface 53, while a dark portion as a black portion represents a low-illuminance region. The high-illuminance region is distributed in an annular shape centering on the light-emitting region S1 of the light-emitting element 23.

FIG. 8B shows an illuminance profile in an XZ section including the centers of the light-emitting element 23 and the light-receiving element 24. In the illuminance profile, a low-illuminance region is present within a radius Ri from the center of the light-emitting region S1 as the reference. Placing the light-receiving region S2 in the low-illuminance region can provide a sensor signal which is not affected by the unnecessary light rays without using any light-shield means. In this manner, placing the light-receiving region S2 in the abovementioned low-illuminance region can provide the effective reflected light rays from the object with a high S/N ratio without using the light-shield member used in the related art.

In FIG. 8B, the light-receiving region S2 may be placed not only on the inner side (<Ri) of the annular region formed by the totally reflected light with high intensity from the interface 53 but also on the outer side (>Ro) of the high-illuminance region to avoid the placement in the high-illuminance region.

The placement condition of the light-receiving region S2 can be represented with an expression based on the primary dimensions of the package. The refractive index of the sealing resin 51 in FIG. 7 is represented as Ni, the refractive index of the medium in the external region of the package, that is, the outside of the light-transmissive member as No, the distance between the light-emitting region S1 and the interface 53 as D1, the distance between the light-receiving region S2 to the interface 53 as D2, and the radius of the totally-reflection region as $R_{max}$. The radius $R_{max}$ is determined by the position of the light ray applied to the light-receiving element 24 after it impinges on the interface 23 at an incident angle larger than the critical angle and totally reflected thereby, with the center of the light-emitting region S1 used as the reference position (center):

$$R_{max} = D1 \cdot \tan\{\sin^{-1}(No/Ni)\} + D2 \cdot \tan\{\sin^{-1}(No/Ni)\} \quad (1)$$

Since the illuminance of the totally reflected light ray on the light-receiving element 24 shows the highest value at the radius $R_{max}$, the placement condition of the light-receiving region S2 is determined such that it should be disposed on the inner side of the illuminance peak position. When the placeable area is determined with approximately 15% of the intensity of the totally reflected light used as a threshold, the radius Ri of the circular area in which the light-receiving region S2 can be placed is represented as the following expression (2):

$$Ri \approx R_{max} \times 0.85 \quad (2)$$

On the other hand, as for the effective light rays L0, since the effective light rays L0 are inclined at an angle θ0 in FIG. 7 with respect to the principal ray which provides the maximum intensity, the intensity of the effective reflected light rays is reduced accordingly. To increase the intensity of the effective light from the reflective scale 21, a light ray closer to the principal ray axis of the light-emitting element 23 is advantageously used. To this end, placing the light-receiving region S2 closer to the light-emitting region S1 can reduce the angle θ0, which leads to an improved S/N ratio of the sensor signal.

In this manner, the means applied in Embodiment 1 appropriately determines the following conditions so that the light-emitting region S1 and the light-receiving region S2 are placed as close as possible from the abovementioned reasons and that the light-receiving region S2 is located within the radius Ri without being placed in the annular high-illuminance region:

the heights D1 and D2 of the interface 53 relative to the light-emitting element 23 and the light-receiving element 24;

the mounting position of the light-receiving element 24;

the placement of the light-receiving region S2 on the light-receiving element 24;

the shape and area of the light-receiving region S2; and the refractive index of the material of the interface 53.

Specific examples of numeric values in Embodiment 1 include D1=D2=0.70 mm, Ni=1.54 (epoxy resin), and No=1.00 (air). From those values, Ri is nearly equal to 1.05 mm. The shape of the light-receiving region S2 is a rectangular shape 0.5 mm by 1.0 mm. The chip interval between the light-emitting element 23 and the light-receiving element 24 is 0.2 mm.

Figure 9:
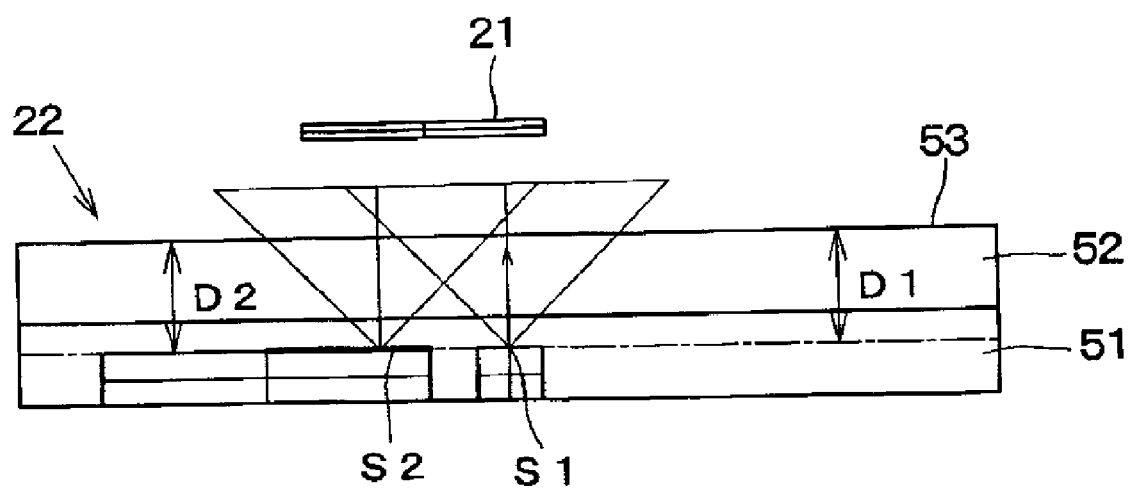
FIG. 9 is a section of a simulation model in Embodiment 1.
Figure 10:
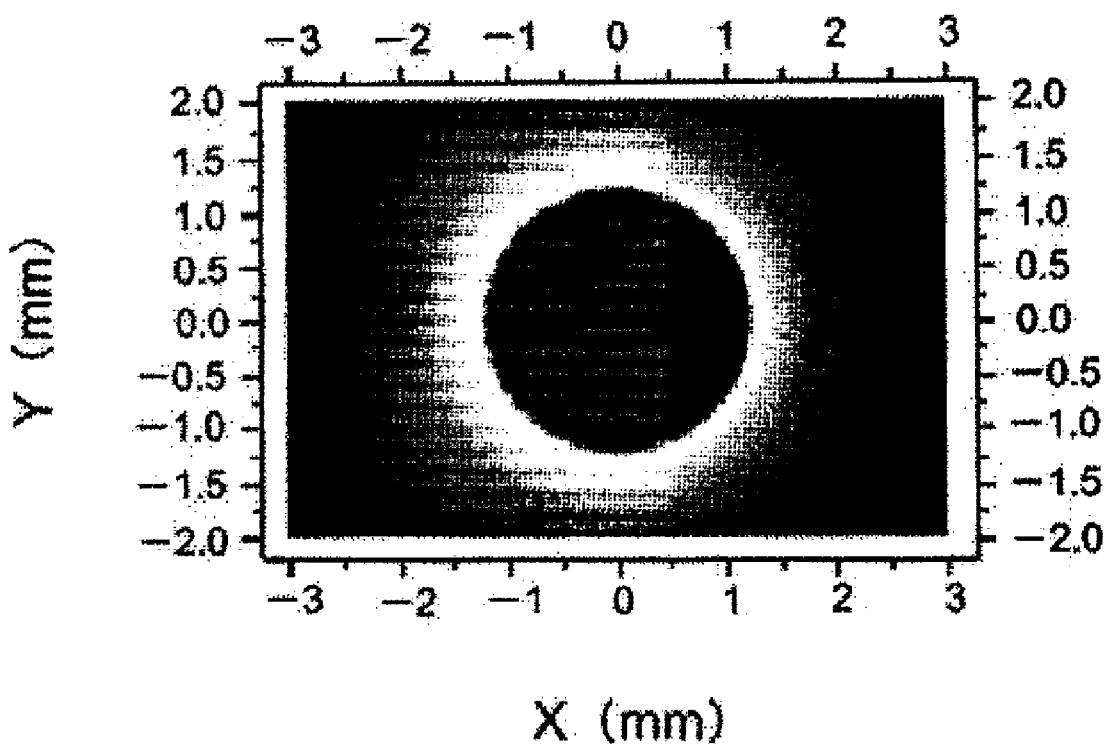
FIG. 10 shows an illumination distribution chart of the simulation model shown in FIG. 9.

FIG. 9 is a section view showing the simulation model shown above. FIG. 10 shows the illuminance distribution chart in the observation plane PL on which the effective reflected light from the reflective scale 21 is superposed on the reflected light from the interface 53. It can be seen that the scale pattern of the reflective scale 21 is projected to the inside of the annular high-illuminance region to provide a sensor signal with a high S/N ratio.

Figure 11A:
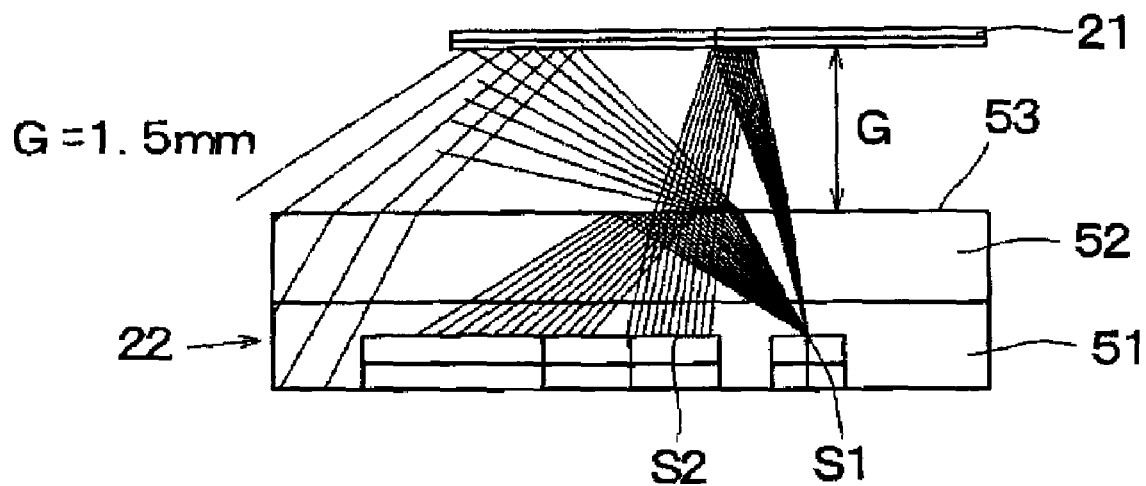
FIGS. 11A to 11D are schematic diagrams for explaining various optical paths with different gaps in the reflective encoder in Embodiment 1.
Figure 11B:
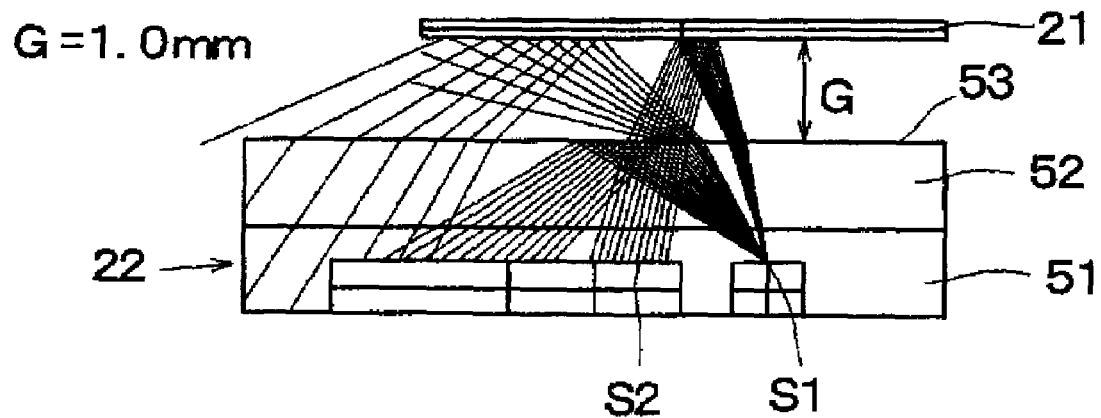
Figure 11C:
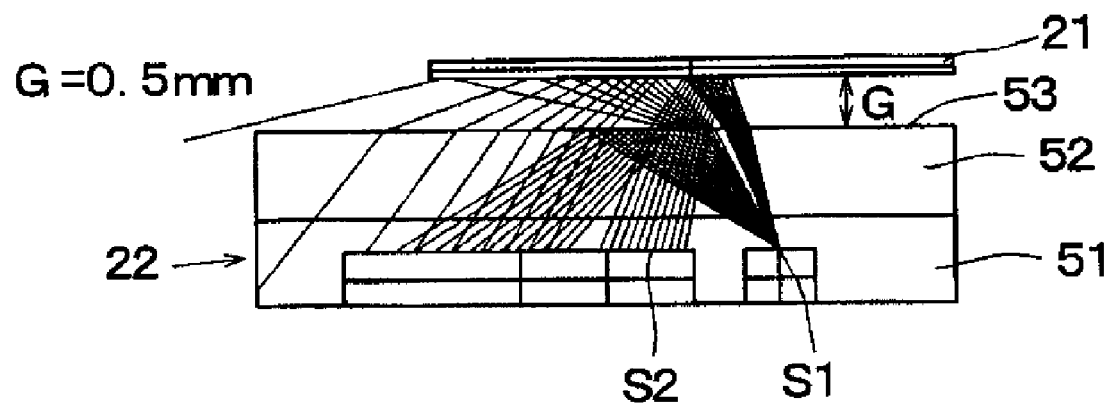
Figure 11D:
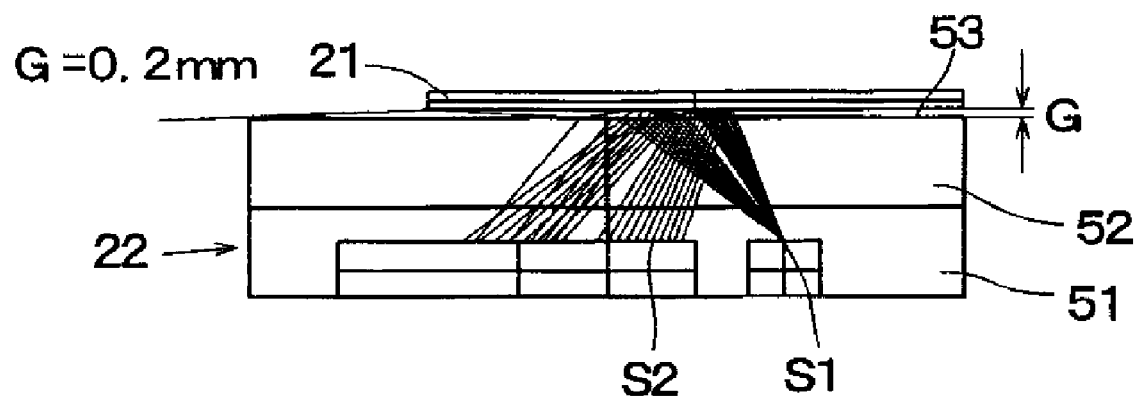

FIGS. 11A to 11D show optical paths when the gap G between the reflective scale 21 and the detection head 22 in Embodiment 1 is set to values of 1.5 mm (FIG. 11A), 1.0 mm (FIG. 11B), 0.5 mm (FIG. 11C), and 0.2 mm (FIG. 11D). In any of FIGS. 11A to 11D, the totally reflected light ray from the interface 53 does not enter the light-receiving region S2, so that a sensor signal with a favorable S/N ratio can be provided.

Figure 12:
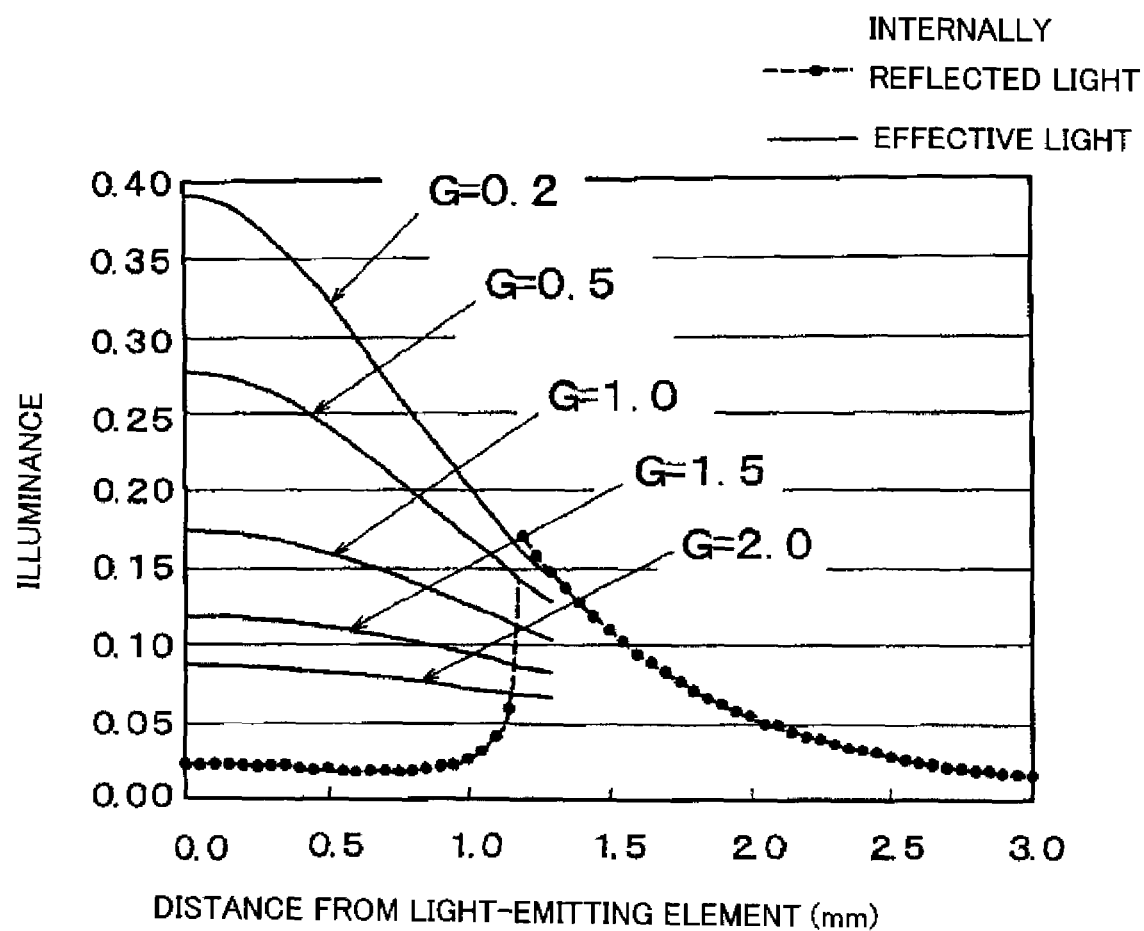
FIG. 12 is a graph of illuminance when the gap from the light-emitting element is used as a parameter in Embodiment 1.

FIG. 12 shows the illuminance distribution on the line connecting the light-emitting region S1 and the light-receiving element 24. The horizontal axis represents the distance in the direction of the light-receiving element 24 from the position of the light-emitting element 23 as the origin. For the illuminance distribution on the line, (1) the effective light from the reflective scale and (2) the reflected light and the totally reflected light from the interface 53 are plotted. The curves show the results when the gap G between the reflective scale 21 and the detection head 22 is used as a parameter.

From the inverse-square law of distance, as the value of the gap G is larger, the illuminance of the effective reflected light is lower. On the other hand, the reflected light and the totally reflected light from the interface 53 are naturally independent of the gap parameter of the reflective scale 21 and do not change with a change in the gap G.

Figure 13:
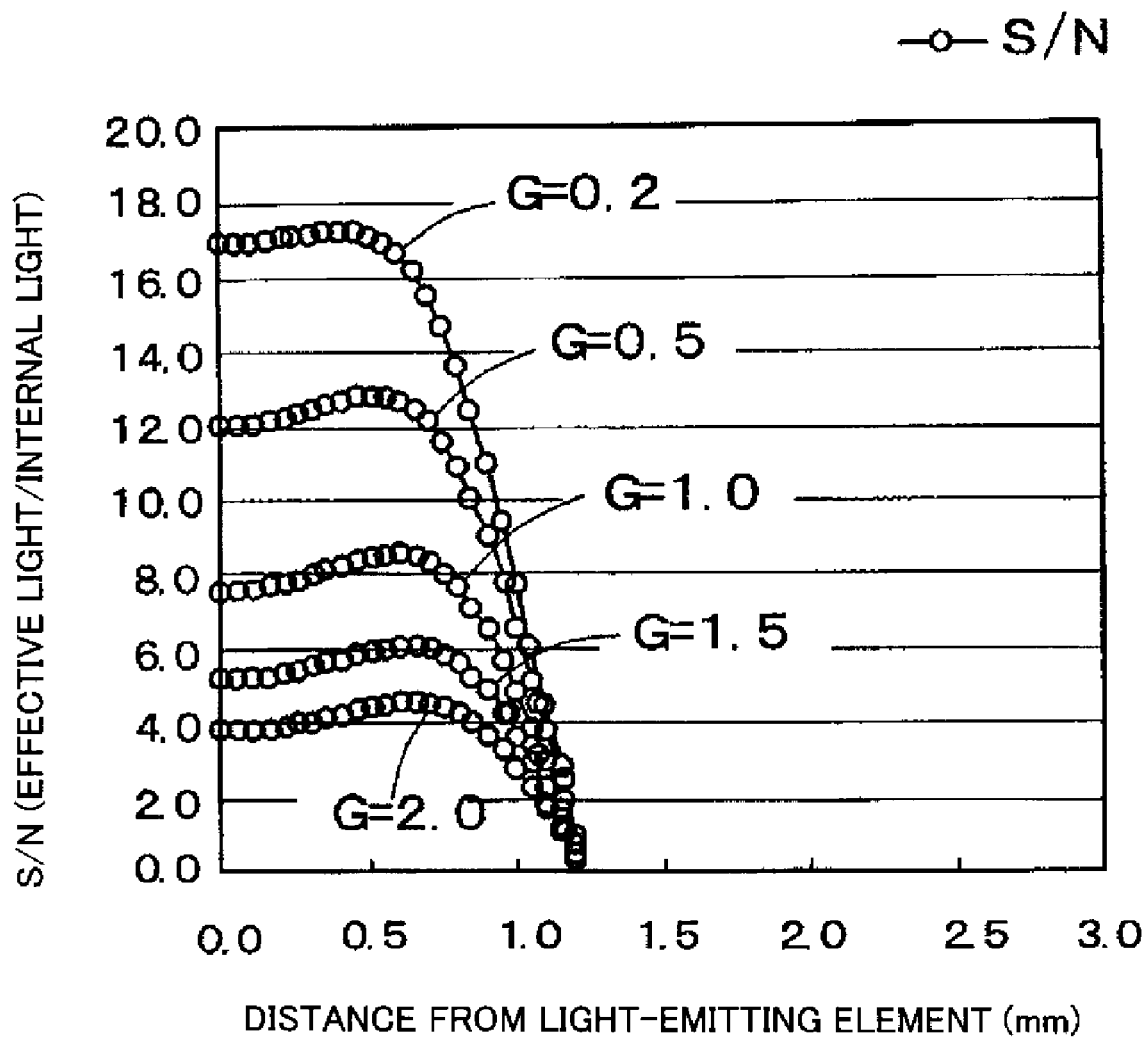
FIG. 13 is a graph showing the relationship between internal reflected light and effective light in Embodiment 1.

FIG. 13 shows variations in the optical S/N ratio of the sensor signal that is represented by the effective ratio of light to noise light when a change in the gap is used as a parameter.

As a notable characteristic, in a conventional reflective sensor including a light-shield member, the effective light ray is blocked by the light-shield member at the gap of 0.2 mm (G=0.2 mm), so that the sensor cannot be used practically with that gap. In contrast, it can be seen from FIG. 13 that the reflective sensor of Embodiment 1 can provide the sensor signal with an extremely high optical S/N ratio in that close gap region. At the gap of 2.0 mm (G=2.0 mm), the S/N ratio is equal to or larger than three. Consequently, it can be shown that the effective signal can be provided in a wide range of gap variations.

Figure 14A:
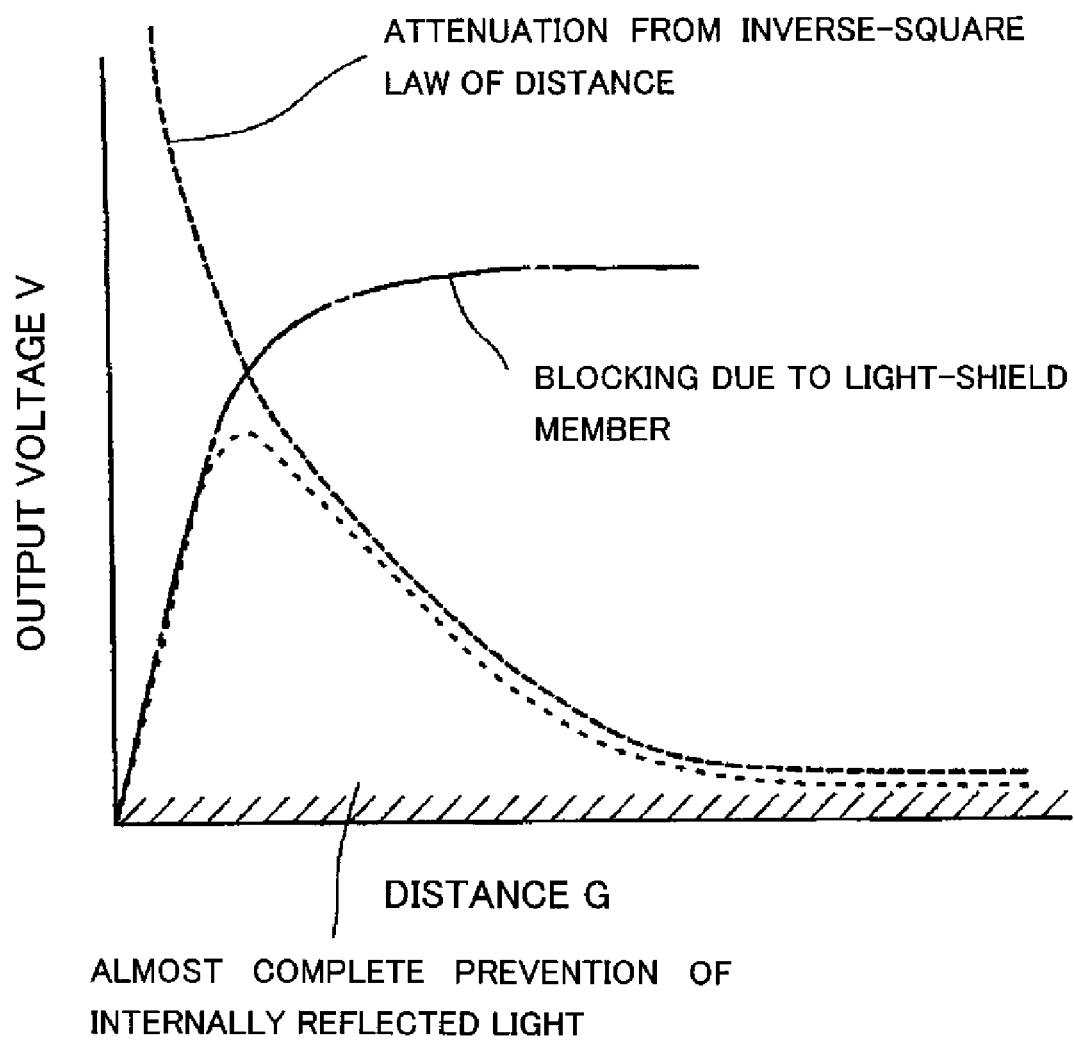
FIGS. 14A and 14B are graphs for comparing the gap characteristic of the reflective encoder of Embodiment 1 and the gap characteristic of a reflective encoder in the related art.
Figure 14B:
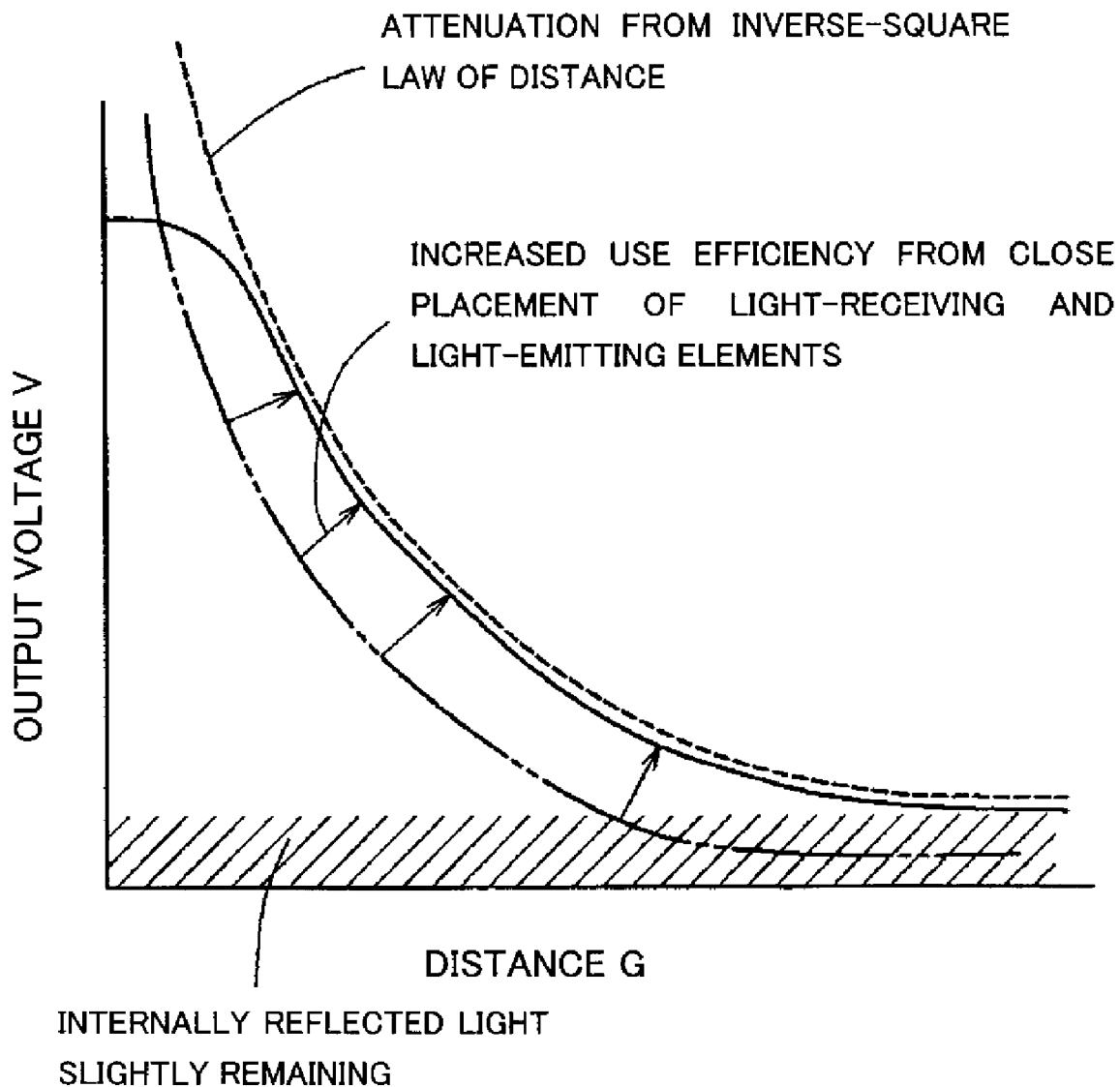

FIGS. 14A and 14B show a difference in gap characteristics between the conventional reflective sensor including the light-shield member and the reflective sensor of Embodiment 1. As illustrated in a graph of FIG. 14A showing the related art, the distance sensitivity between the reflective sensor and the reflective sample is increased when the sensor is used in the close gap region in the related art. Thus, the use of the reflective sensor in such a close distance region should be avoided practically, and an extra space area is needed accordingly.

In the reflective sensor of Embodiment 1 shown in FIG. 14B, since the interval between the light-emitting and light-receiving elements is reduced and the light ray close to the optical axis of the light-emitting element 23 is used, the use efficiency of light is improved as compared with the related art. Embodiment 1 involves no light blocking resulting from the light-shield member included in the related art, so that the effective signal area in the close gap region is widened and the mounting tolerance is relaxed. In addition, the reflective sensor can be used with the close gap, which provides advantages in reducing the size thereof and the necessary space.

In Embodiment 1, the reflective encoder can provide the sensor signal with a high S/N ratio without using the light-shield member and can significantly improve the performance in the close gap region of the reflective scale 21 and the detection head 22. In addition, the light-emitting element 23 and the light-receiving element 24 are placed closer to each other than in the related art to improve the use efficiency of light, thereby allowing a reduction in power consumption of the light-emitting element 23. Furthermore, Embodiment 1 enables a reduced size, uniform quality, and a lower price at the same time.

Embodiment 2

Figure 15:
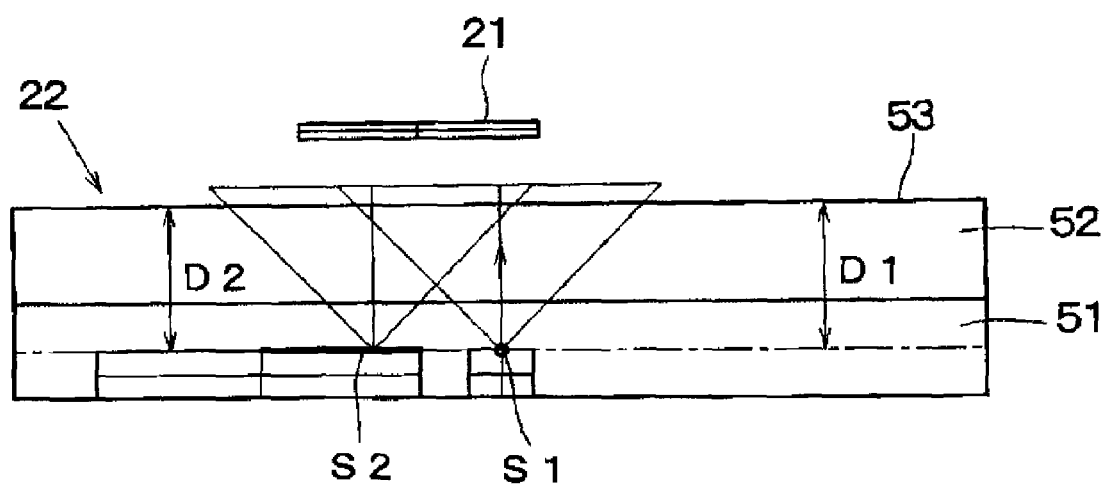
FIG. 15 is a section view showing a simulation model of a reflective encoder that is Embodiment 2 of the present invention.

FIG. 15 is a section view showing a simulation model of a reflective sensor that is Embodiment 2 of the present invention. In this embodiment, the members identical to those described in Embodiment 1 are designated with the same reference numerals. This is also applied to the later-described Embodiments 3 to 5.

In this reflective sensor, the height of the interface 53 is increased and the radius Rmax of the annular high-illuminance region produced by the totally reflected light is increased as compared with Embodiment 1. Specifically, D1 and D2 are set to 0.90 mm, Ni to 1.54 (epoxy resin), and No to 1.00 (air). From those values, Ri is nearly equal to 1.45 mm.

Figure 16:
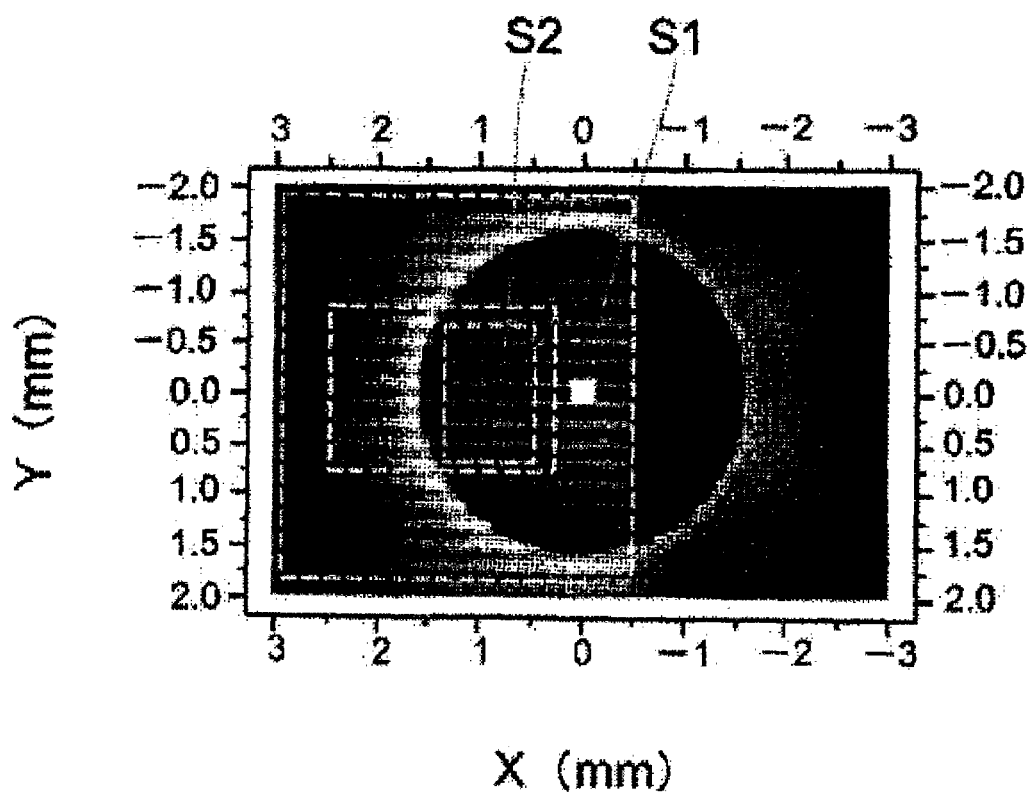
FIG. 16 shows an illuminance distribution chart in Embodiment 2.

As a result, as shown in the illuminance distribution chart of FIG. 16, the size of an allowable circle in which the light-receiving portion can be placed is increased, and the area of the light-receiving region S2 of the light-receiving element 24 can be increased as compared with Embodiment 1. For example, in this case, the size of the light-receiving region S2 can be increased to a rectangular approximately 0.7 mm by 1.4 mm.

Embodiment 3

Figure 17:
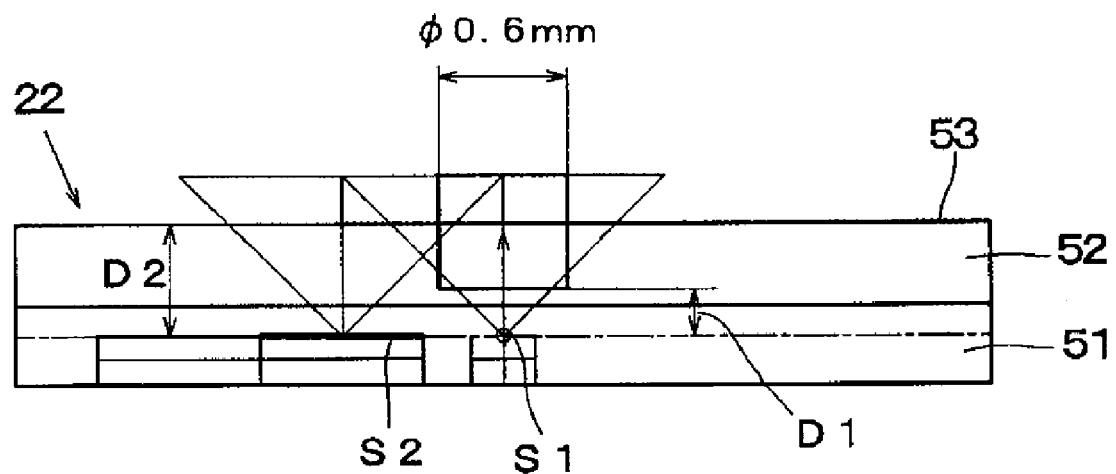
FIG. 17 is a section view showing a simulation model of a reflective encoder that is Embodiment 3 of the present invention.

FIG. 17 is a section view showing a simulation model of a reflective sensor that is Embodiment 3 of the present invention. In this embodiment, as for the height of the interface 53, the height D1 on the light-emitting-element side and the height D2 on the light-receiving-element side have different values. Specifically, D1 is set to 0.3 mm, D2 to 0.7 mm, Ni to 1.54 (epoxy resin), and No to 1.00 (air). From those values, Ri is nearly equal to 0.85 mm.

In Embodiment 3, the light-emitting element 23 is covered 0.3 mm above with the light-transmissive sealing resin 51 and the transparent glass 52. A cylindrical concave portion with an inner diameter of 0.6 mm and a depth of 0.4 mm is formed in the upper part of the transparent glass 52.

Figure 18:
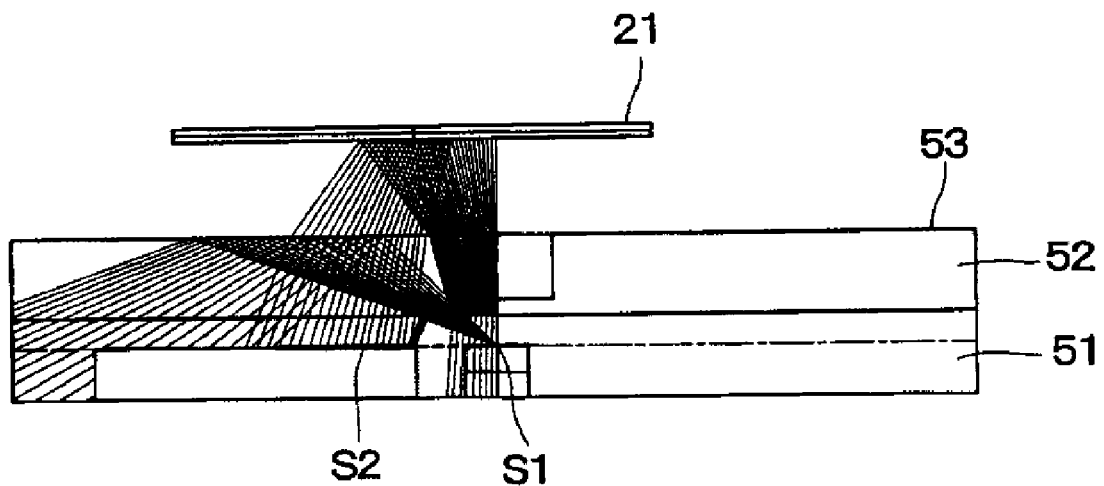
FIG. 18 is a schematic diagram for explaining optical paths in Embodiment 3.

FIG. 18 shows optical paths of the effective reflected light and the totally reflected light in the package in Embodiment 3. The light-receiving region S2 is placed at a position where the totally reflected light does not enter.

Figure 19:
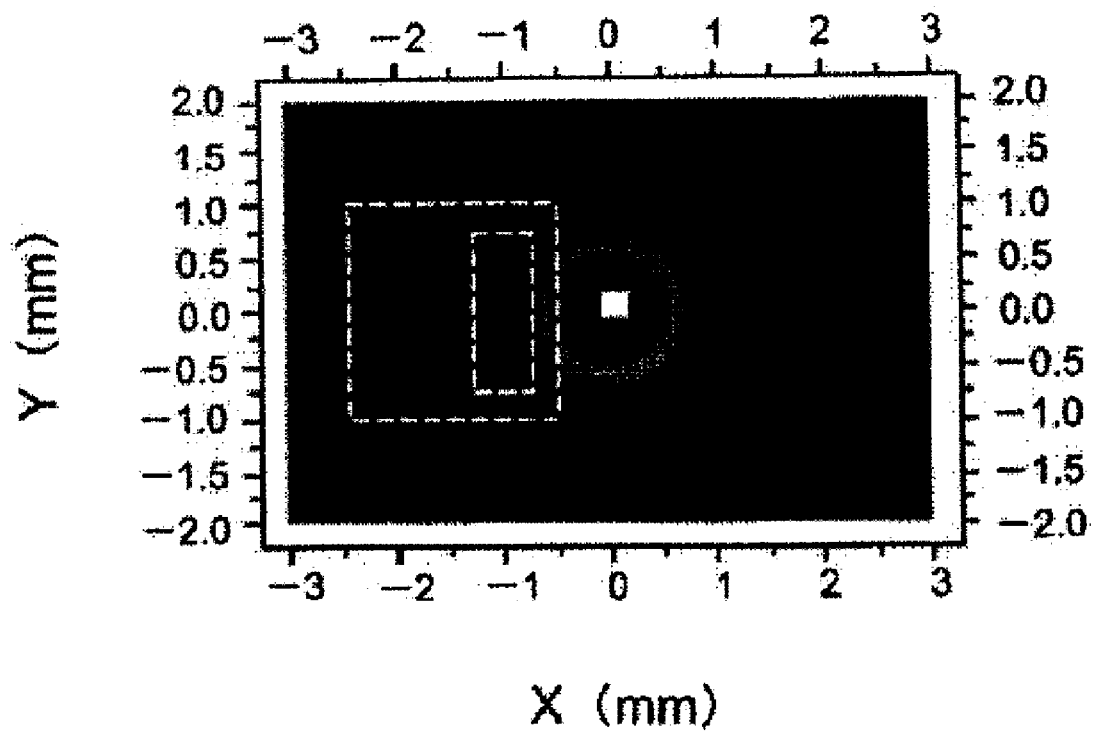
FIG. 19 shows an illuminance distribution chart in Embodiment 3.

As shown in the illuminance distribution chart of FIG. 19, the size of an allowable circle in which the light-receiving region S2 can be placed is reduced to make it difficult to place the light-receiving region S2 within the allowable circle as in Embodiments 1 and 2. In this case, however, the light-receiving region S2 can be placed outside the circle to provide the effects similar to those in Embodiments 1 and 2.

Embodiment 4 is disadvantageous in reducing the size of the reflective encoder since the area for mounting is increased, but the light-receiving region S2 can be placed on the light-receiving element 24 with a higher degree of flexibility, and the size of the light-receiving region S2 is not significantly limited. In terms of those points, the light-receiving region S2 can be placed in a manner which is not possible in Embodiments 1 and 2 in which the light-receiving region S2 is placed within the allowable circle.

Embodiment 4

Figure 20:
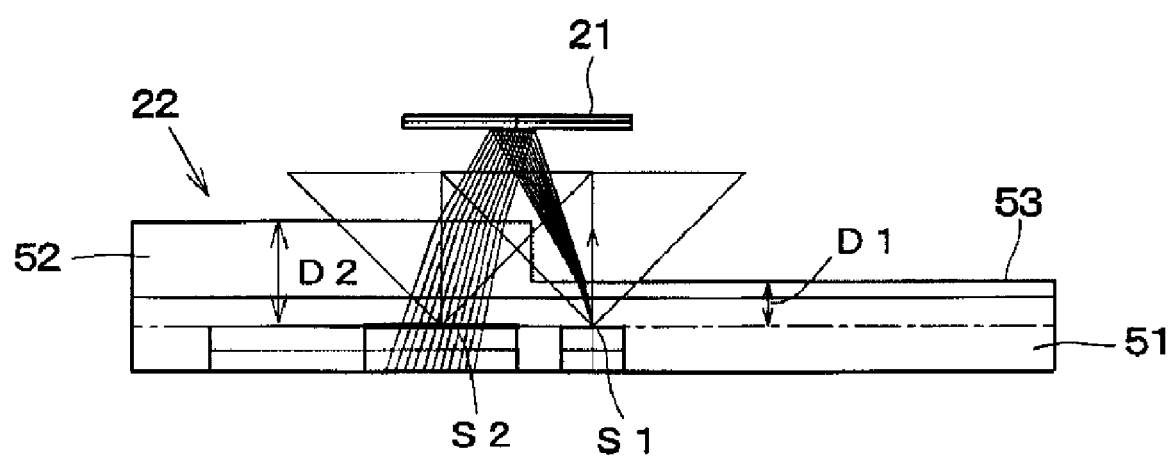
FIG. 20 is a section view showing a simulation model of a reflective encoder that is Embodiment 4 of the present invention.

FIG. 20 is a section view showing a simulation model of a reflective sensor that is Embodiment 3 of the present invention. In this embodiment, for the height of the interface 53, the height D1 on the light-emitting-element side and the height D2 on the light-receiving-element side have different values as in Embodiment 3. Specifically, D1 is set to 0.3 mm, D2 to 0.7 mm, Ni to 1.54 (epoxy resin), and No to 1.00 (air). From those values, Ri is nearly equal to 0.85 mm.

Figure 21:
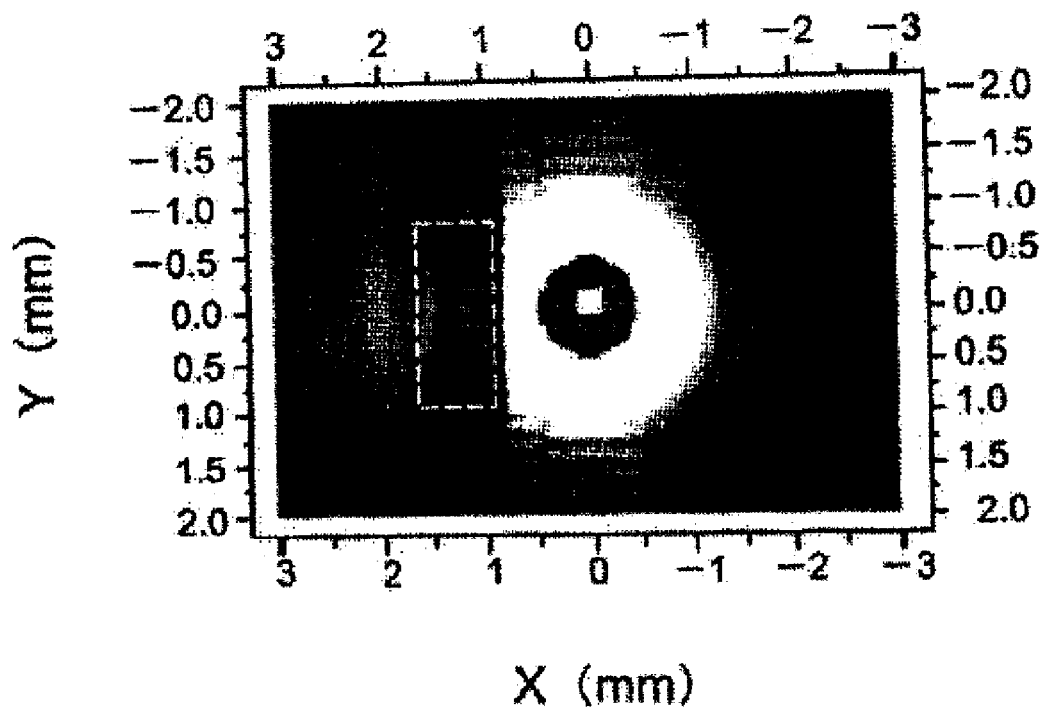
FIG. 21 shows an illuminance distribution chart in Embodiment 4.

As shown in the illuminance distribution chart of FIG. 21, complicated illuminance distribution is provided in this case. The light-receiving region S2 can be placed at a position shown by a dotted line to attain the effects similar to those in Embodiment 1.

Embodiment 5

Figure 22:
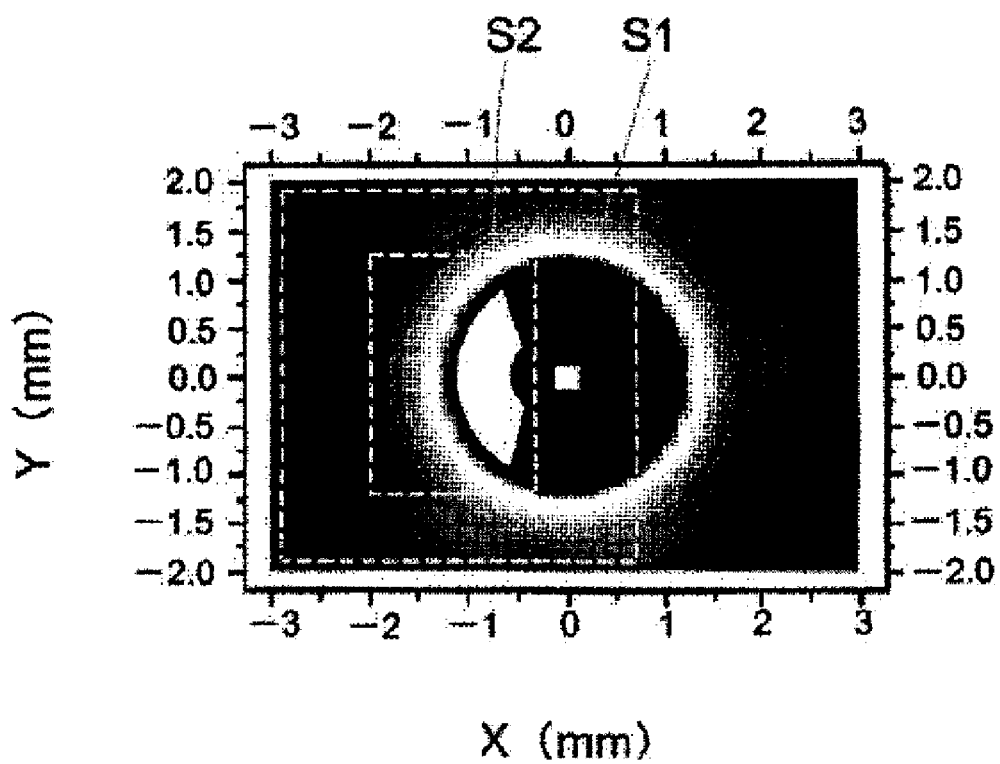
FIG. 22 shows an illuminance distribution chart of a reflective encoder that is Embodiment 5 of the present invention Embodiment 5.
Figure 23:
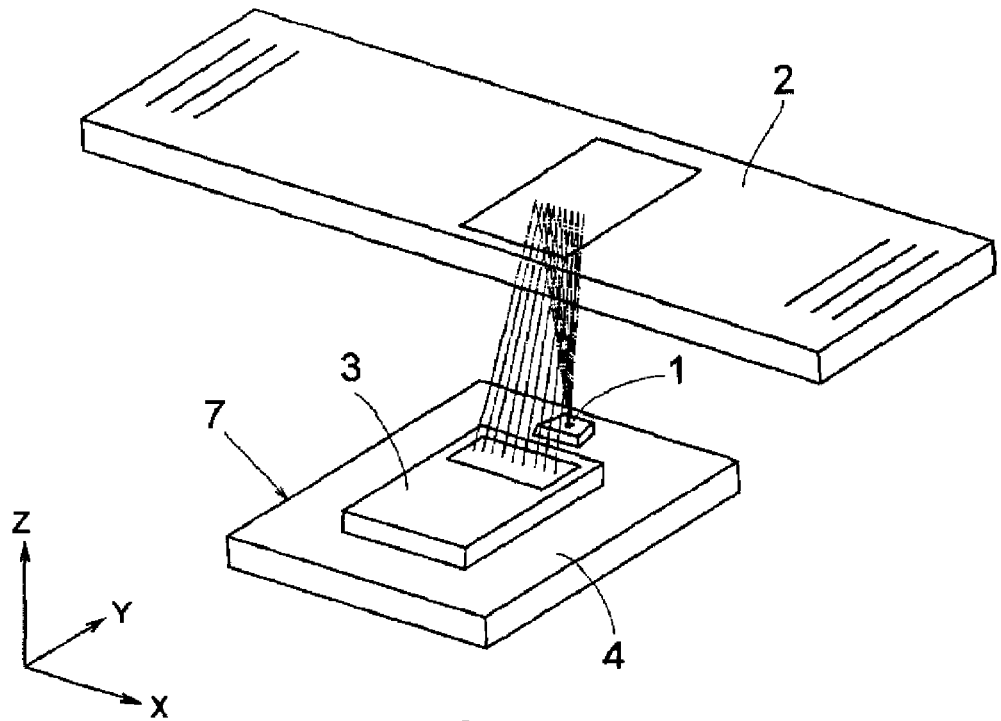
FIG. 23 is a perspective view showing a reflective encoder in the related art.
Figure 24:
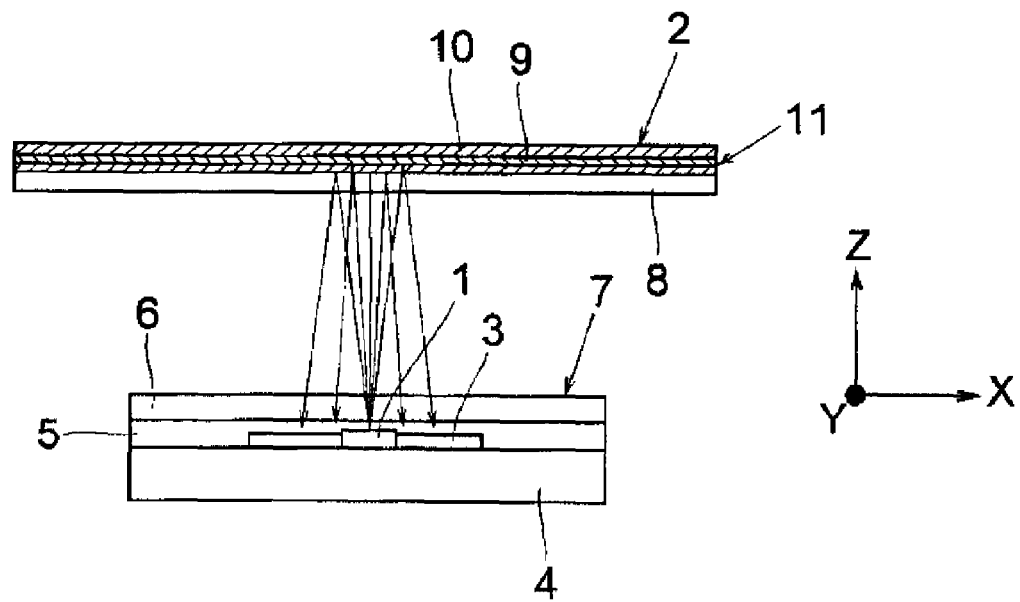
FIG. 24 is an XZ section of the reflective encoder in FIG. 23.
Figure 25:
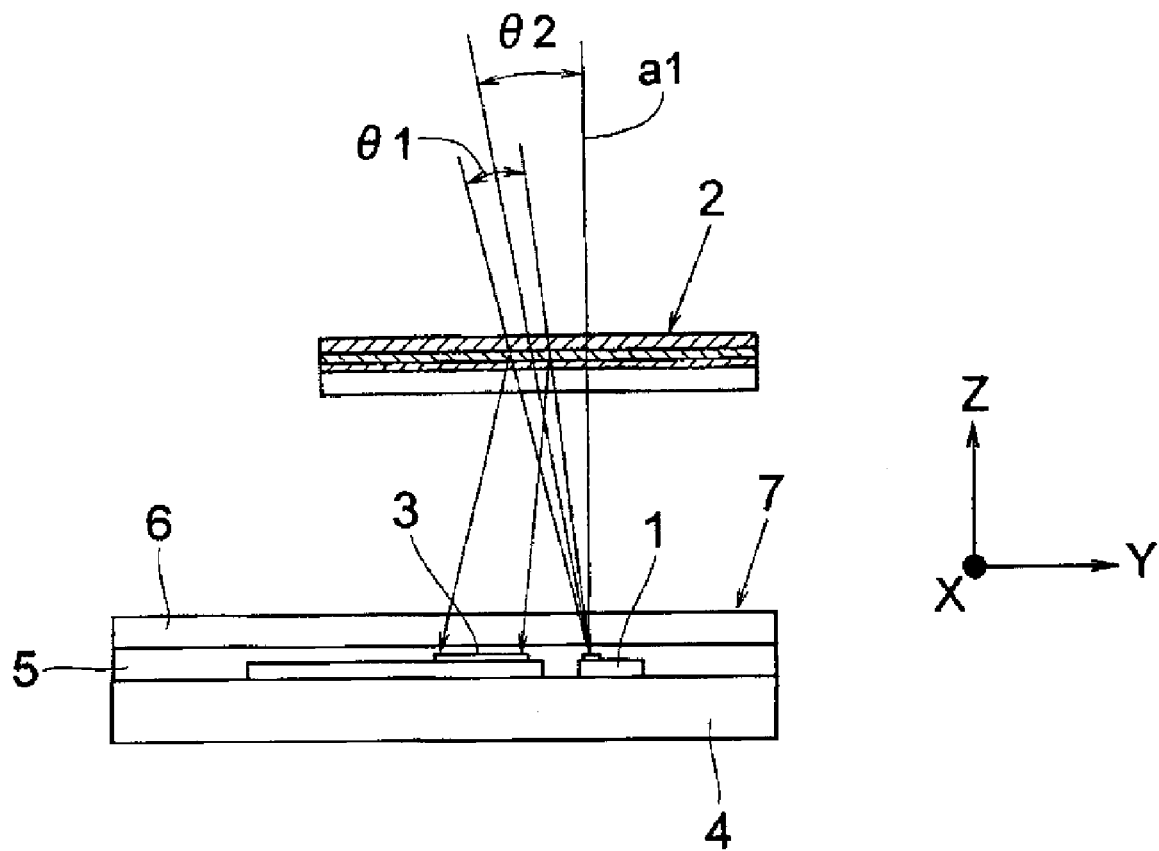
FIG. 25 is a YZ section of the reflective encoder in FIG. 23.
Figure 26:
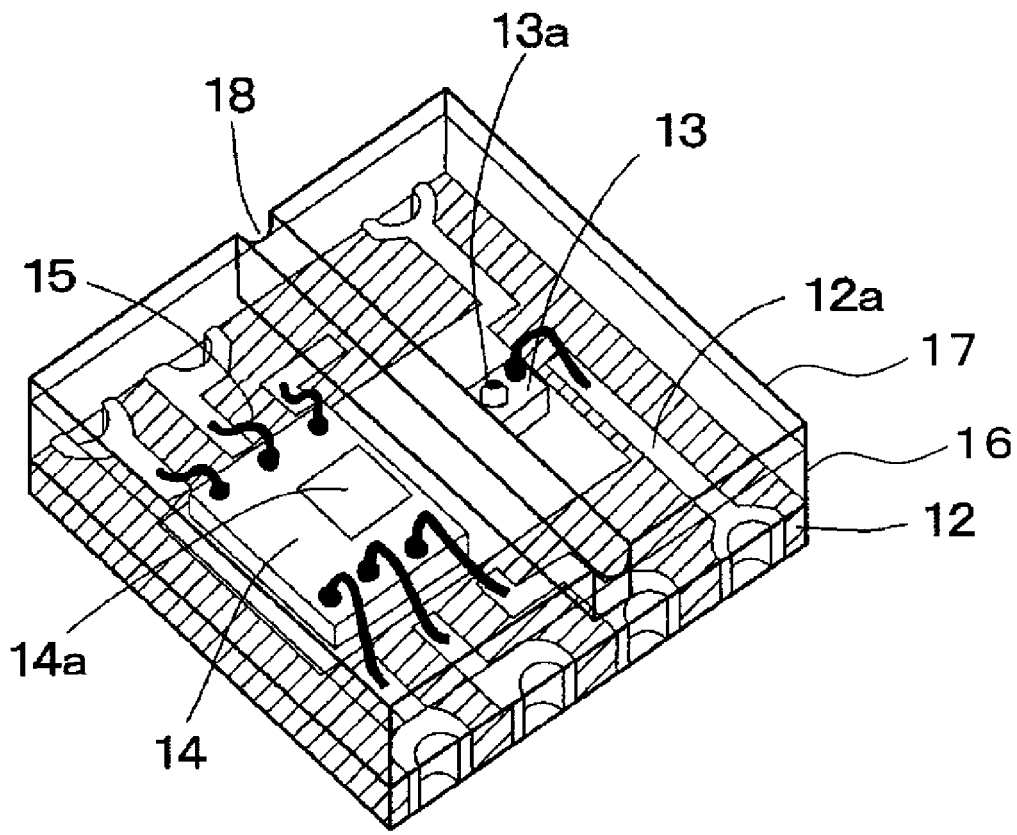
FIG. 26 is a perspective view showing another reflective encoder in the related art.
Figure 27:
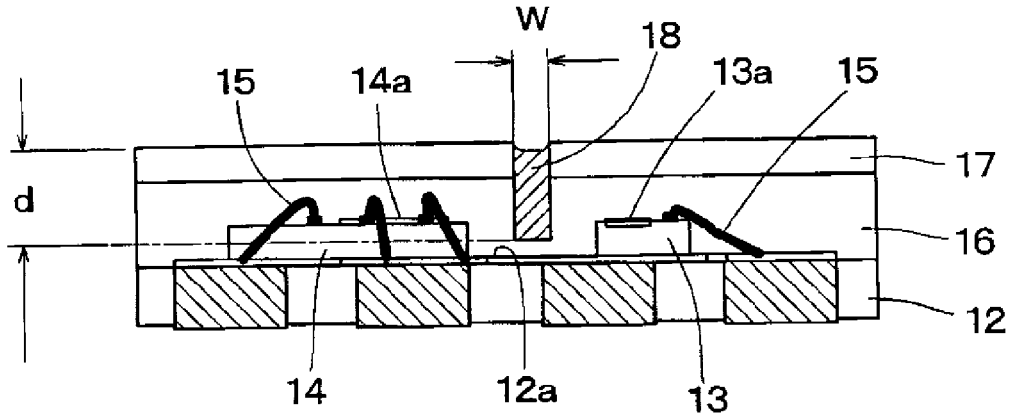
FIG. 27 is a section view of the reflective encoder in FIG. 26.
Figure 28:
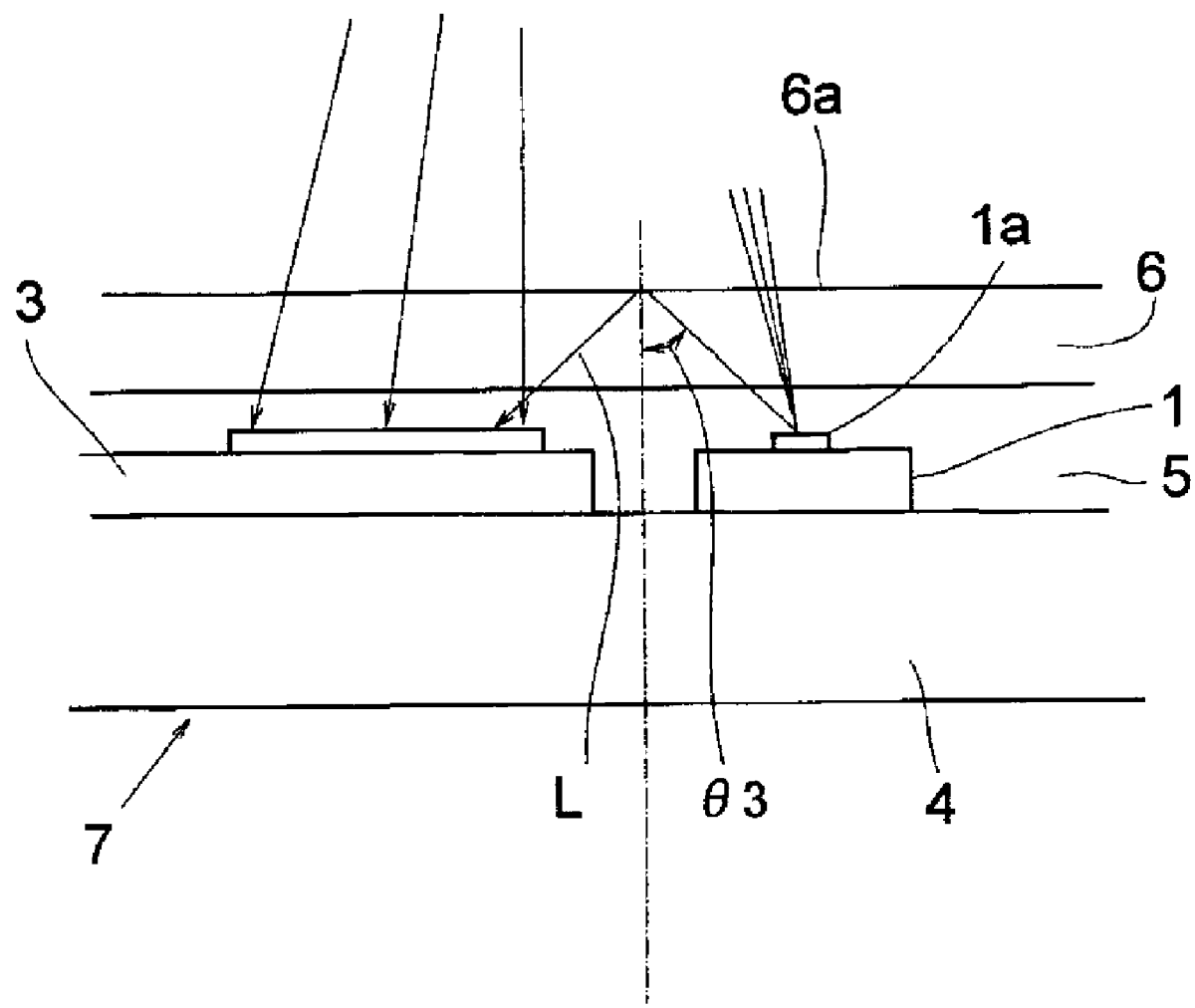
FIG. 28 is a section view showing an enlarged view of part of FIG. 25.
Figure 29:
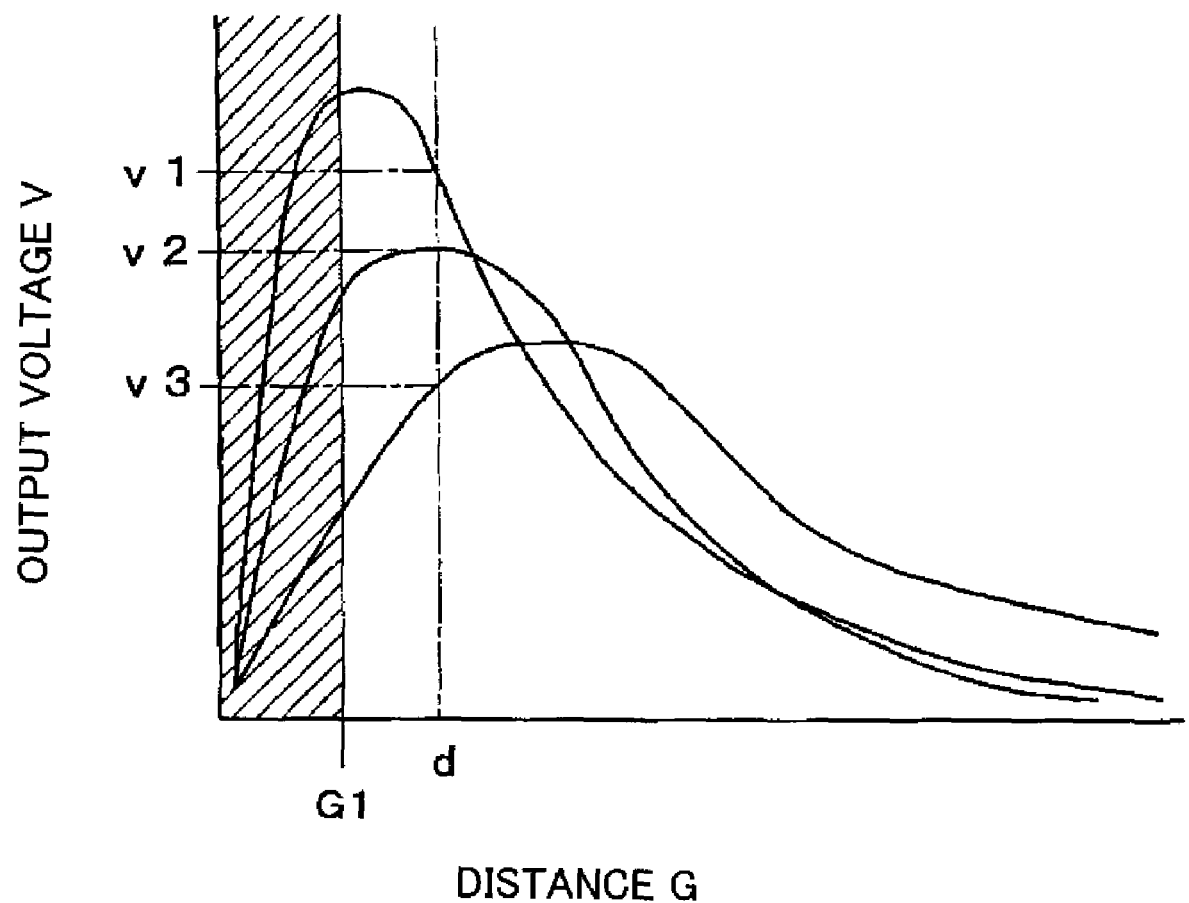
FIG. 29 is a graph showing an output voltage for a gap in another reflective encoder in the related art.

FIG. 22 shows an illuminance distribution chart of a reflective sensor that is Embodiment 5 of the present invention. In this embodiment, the shape of the light-receiving region S2 is changed as compared with Embodiment 1. For the height of the interface 53, the height D1 on the light-emitting-element side and the height D2 on the light-receiving-element side have the same values. Specifically, D1 is set to 0.7 mm, D2 to 0.7 mm, Ni to 1.54 (epoxy resin), and No to 1.00 (air). From those values, Ri is nearly equal to 1.05 mm.

When the light-receiving region S2 is placed within the radius Ri such that the light is used as effectively as possible, the light-receiving region S2 is formed in a sector shape (or a fan-like shape) or an arc shape along the allowable circle. This substantially enables a larger amount of the effective reflected light from the reflective scale 21 to be taken by the light-receiving region S2. As a result, the S/N ratio of the sensor can be improved.

Various shapes of the interface 53 can be contemplated in Embodiment 5. Irrespective of the shape of the interface 53, the position of the light-receiving element 24 relative to the light-emitting element 23 and the height of the interface 53 can be changed to prevent the totally reflected light reflected at the interface 53 from entering the light-receiving region S2.

According to the reflective sensors of Embodiments 1 to 5 described above, the effects listed below can be obtained.

Since no light-shield member is required between the light-emitting element and the light-receiving element, the light-emitting element and the light-receiving element can be mounted close to each other to reduce the mounting area and the size of the reflective sensor and to eliminate variations in performance due to the light-shield member.

(2) The steps necessary for providing the light-shield function are reduced and the package is reduced in size, so that the production efficiency is greatly enhanced, the manufacture cost can be reduced, and the quality and reliability are significantly improved.

(3) The light-emitting element and the light-receiving element mounted close to each other allow light rays close to the optical axis to be received, of the light rays emitted by the light-emitting element. Thus, the S/N ratio of the sensor signal is improved. In addition, the use efficiency of light is increased, and the driving current for the light-emitting element is reduced, so that low power consumption is advantageously achieved.

(4) As compared with the related art in which the light-shield member is used, the gap characteristic is greatly improved, and the effective sensor signal is provided even when the reflective sensor is close to an object to be measured.

Embodiments 1 to 5 have been described primarily in conjunction with the reflective encoder, other reflective sensors such as a reflective photointerrupter can be used in alternative embodiments of the present invention.

Embodiment 6

Figure 30:
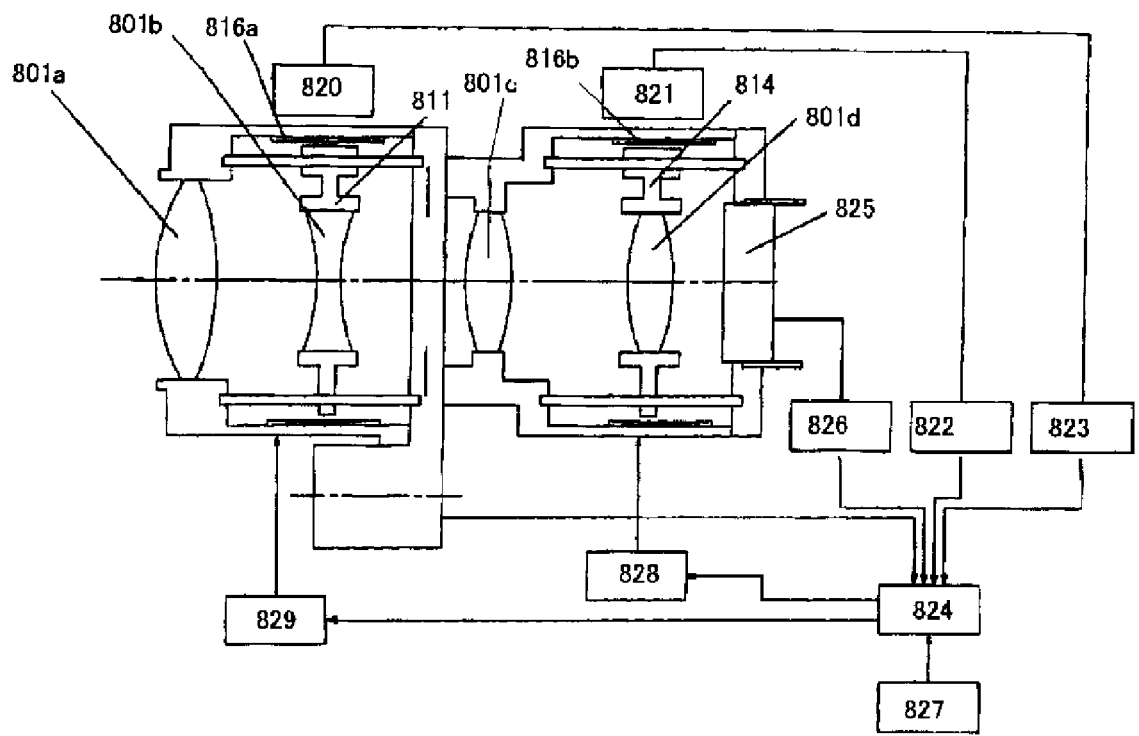
FIG. 30 is a block diagram showing the configuration of a video camera on which the reflective encoder of Embodiments 1 to 5 is mounted, which is Embodiment 6 of the present invention.

FIG. 30 shows the configuration of a lens system of a video camera serving as an apparatus on which the reflective sensor described in Embodiments 1 to 5 is mounted. FIG. 30 shows the configuration in which a variator lens 801*b* for providing variable magnification and a focus lens 801*d* are driven by using a voice coil actuator. Encoders 816*a* and 820 for zoom and encoders 816*b* and 821 for autofocus are mounted to detect the absolute positions of the variator lens 801*b* and the focus lens 801*d*, respectively.

Reference numerals 816*a* and 816*b* show linear encoder scales, and 820 and 821 detection heads (reflective encoders) described in Embodiments 1 to 5.

Outputs from the detection heads 820 and 821 are read by read circuits 823 and 822, respectively, and supplied to a CPU 824. Information on a focus state is also supplied to the CPU 824 via a read circuit 826 with a video signal from a CCD 825.

The CPU 824 determines a current value or a waveform thereof to be passed through each voice coil based on the abovementioned information and information previously stored in a ROM 827, and passes current through the coils 816*a* and 816*b* via drivers 829 and 828, respectively. With this system, the positions of the variator lens 801*b* and the focus lens 801*d* are controlled such that an in-focus state is maintained.

To realize the video lens system using the voice coil actuator as in the example described above, an encoder for detecting the lens position is required with an extremely small size and high accuracy. The reflective sensor described in Embodiments 1 to 5 is particularly suitable.

As the size of such a video lens system is reduced, higher positioning sensitivity of an optical system (lens) tends to be needed. This requires an encoder having an extremely small size, high resolution, and high accuracy. Low power consumption is also required. The use of the reflective sensor of the power-saving type of Embodiments 1 to 5 in such an apparatus is effective in reducing the power consumption.

Conventional encoders include a type in which a brush follows an electrode on which a linear volume or a gray code pattern is formed, a type in which position detection is performed with an optical element moving together with a lens holding member and a photoelectrical conversion element such as a PSD.

The encoder can be realized by using the reflective sensor in Embodiments 1 to 5 to allow position detection in a non-contact manner and a significant reduction in space for mounting. Thus, the lens system can be designed with a higher degree of flexibility.

Embodiment 7

Figure 31:
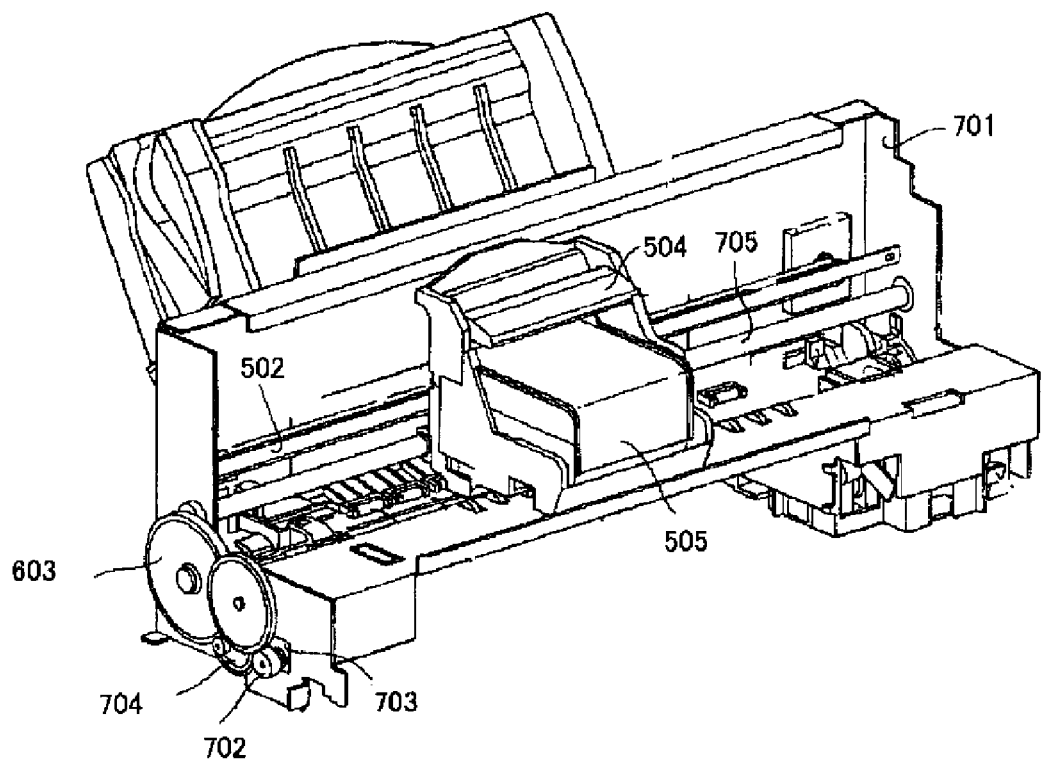
FIG. 31 is a perspective view showing an inkjet printer on which the reflective encoder of Embodiments 1 to 5 is mounted, which is Embodiment 7 of the present invention.

FIG. 31 shows the configuration of an ink-jet printer on which the reflective sensor of Embodiments 1 to 5 is mounted. In Embodiment 7, the reflective sensor (encoder) is used for controlling the driving of a print head in the ink-jet printer.

In FIG. 31, reference numeral 701 shows a housing, 505 a carriage unit which accommodates a print head, an ink tank and the like. Reference numeral 705 shows a guide bar, 703 a driving motor for feeding paper, 702 a gear on a driving shaft, and 704 an idler gear. Reference numeral 603 shows a gear mounted on a main feeding roller shaft. An encoder for detecting a rotation angle is mounted on the main feeding roller shaft.

A linear encoder scale 502 having one end fixed to the housing 701 extends in parallel with the guide bar 705 and has the other end fixed to the housing 701 via a plate spring, not shown.

The scale 502 in Embodiment 7 is provided by forming small grooves at predetermined intervals in a transparent film made of transparent polycarbonate.

Figure 32:
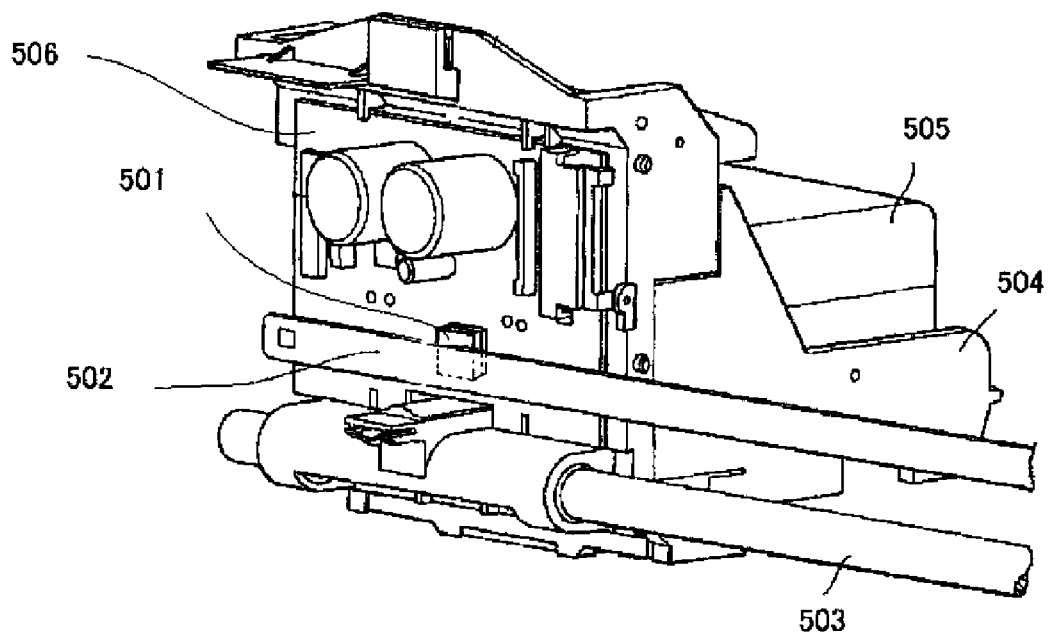
FIG. 32 is a perspective view showing a feed control part of a print head of the inkjet printer.

FIG. 32 shows the configuration in which the reflective sensor (encoder detection head) of Embodiments 1 to 5 is mounted on a carriage of the ink-jet printer.

In FIG. 32, reference numeral 502 shows the linear encoder scale mounted on the housing 701 shown in FIG. 31, and 501 an encoder detection head. They are mounted together with a driving circuit and the like for driving the ink-jet head on a substrate 506 attached to the carriage 504.

Since a limited space can be used for mounting the encoder detection head in the linear encoder for controlling the driving of the carriage of the ink-jet printer, it is easy to mount the ultra-small reflective sensor described in Embodiments 1 to 5 as the detection head. In other words, the reflective sensor can be easily incorporated into the printer as compared with the conventional transmissive encoder. From the viewpoint of low power consumption, the reflective encoder is effectively mounted on a mobile printer, for example.

Embodiment 8

Figure 33:
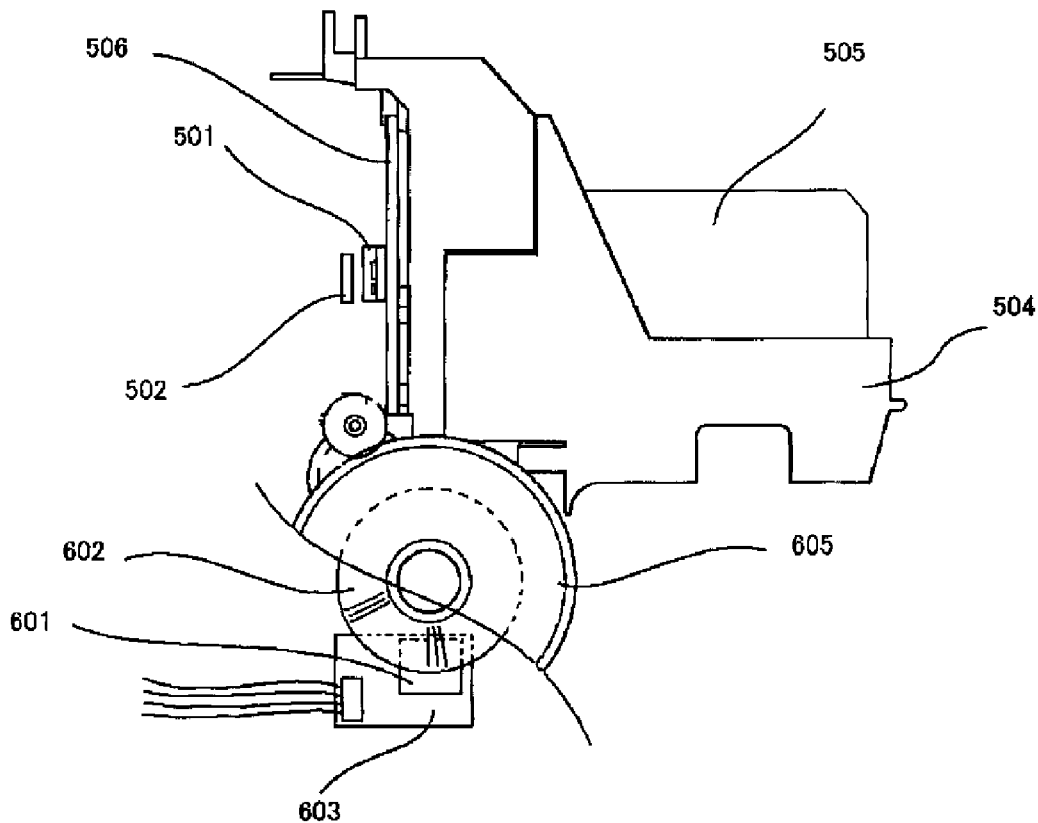
FIG. 33 is a perspective view showing a paper feed control part of the inkjet printer, which is Embodiment 8 of the present invention.

The ink-jet printer requires not only the linear encoder for controlling the position of the carriage but also a rotary encoder for detecting the rotation angle of a roller for feeding paper. FIG. 33 is a side view of the printer. FIG. 33 shows a rotary encoder scale 602 mounted behind the main paper-feeding-roller-driving gear 605, a detection head 601, and a substrate 603 on which the detection head 601 is mounted.

The detection head having the simplified configuration as described in Embodiments 1 to 5 involves only slight manufacture variations and needs a small number of parts. This allows electrical division for high resolution and high accuracy. Thus, the rotary encoder scale for angle detection can be reduced in size to the extent that it is smaller than the diameter of the driving gear 605 as shown in FIG. 33. Conventionally, encoder scales having a large diameter have been used for detecting the position of paper feed with high resolution.

As in the linear encoder described in Embodiments 1 to 5, it is effectively mounted on a mobile printer, for example, from the viewpoint of low power consumption.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

Furthermore, the present invention is not limited to these preferred embodiments and various variations and modifications may be made without departing from the scope of the present invention.

This application claims foreign priority benefits based on Japanese Patent Application No. 2006-197041, filed on Jul. 19, 2006, which is hereby incorporated by reference herein in its entirety as if fully set forth herein.

What is claimed is:

1. A detection head comprising:
    a light-emitting element and a light-receiving element which are provided on a surface; and
    a light-transmissive member which covers the light-emitting element and the light-receiving element,
    wherein the light-emitting element includes a light-emitting region, and the light-receiving element includes a light-receiving region which is spaced from the light-emitting region along the surface,
    wherein the light-receiving region is closer to the light-emitting region than a region illuminated with light rays which are totally reflected by an interface between the light-transmissive member and the outside thereof and are directed toward the light-receiving element, and wherein the light-transmissive member is formed of a light-transmissive resin covering over the light-emitting element and the light-receiving element and a light-transmissive glass covering over the light-transmissive resin.

2. A detection head according to claim 1, wherein the light-emitting element is formed of an LED having a current confinement structure.

3. A detection head according to claim 1, wherein the light-receiving region has a sector shape or an arc shape.

4. An apparatus comprising a detection head according to claim 1, wherein the apparatus operates based on information provided by the detection head.

5. A detection head comprising:
a light-emitting element and a light-receiving element which are provided on a surface; and
a light-transmissive member which covers the light-emitting element and the light-receiving element,
wherein the light-receiving element includes a light-receiving region which is provided on the surface within a circle having a radius R from the center of a light-emitting region of the light-emitting element, the radius R being determined as follows:

$$R = D1 \cdot \tan\{\sin^{-1}(No/Ni)\} + D2 \cdot \tan\{\sin^{-1}(No/Ni)\}$$

where Ni represents a refractive index of the light-transmissive member having an interface between the light-transmissive member and the outside thereof, No represents a refractive index of a medium outside of the light-transmissive member which is different from Ni, D1 represents a distance from the light-emitting region of the light-emitting element to the interface, and D2 represents a distance from the light-receiving region of the light-receiving element to the interface.

6. A detection head according to claim 5, wherein the light-receiving element is formed of a photo-IC including a light-receiving portion formed of a plurality of photodiodes and a signal processing part formed of a plurality of first-stage amplifiers and a differential amplifier.

7. An apparatus comprising a detection head according to claim 5, wherein the apparatus operates based on information provided by the detection head.

* * * * *